United States Patent
Takeuchi et al.

(10) Patent No.: US 12,199,180 B2
(45) Date of Patent: Jan. 14, 2025

(54) SEMICONDUCTOR DEVICE INCLUDING A SUPERLATTICE AND AN ASYMMETRIC CHANNEL AND RELATED METHODS

(71) Applicant: ATOMERA INCORPORATED, Los Gatos, CA (US)

(72) Inventors: Hideki Takeuchi, San Jose, CA (US); Richard Burton, Phoenix, AZ (US); Yung-Hsuan Yang, San Jose, CA (US)

(73) Assignee: ATOMERA INCORPORATED, Los Gatos, CA (US)

( * ) Notice: Subject to any disclaimer, the term of this patent is extended or adjusted under 35 U.S.C. 154(b) by 0 days.

(21) Appl. No.: 18/516,279

(22) Filed: Nov. 21, 2023

(65) Prior Publication Data
US 2024/0097026 A1  Mar. 21, 2024

Related U.S. Application Data

(60) Continuation of application No. 17/719,242, filed on Apr. 12, 2022, now Pat. No. 11,869,968, which is a
(Continued)

(51) Int. Cl.
*H01L 29/78* (2006.01)
*H01L 29/06* (2006.01)
(Continued)

(52) U.S. Cl.
CPC ........ *H01L 29/7816* (2013.01); *H01L 29/063* (2013.01); *H01L 29/1045* (2013.01);
(Continued)

(58) Field of Classification Search
CPC ............. H01L 29/7835; H01L 29/1045; H01L 29/063; H01L 29/152; H01L 29/0653;
(Continued)

(56) References Cited

U.S. PATENT DOCUMENTS

| 4,937,204 A | 6/1990 | Ishibashi et al. |
| 5,216,262 A | 6/1993 | Tsu |

(Continued)

FOREIGN PATENT DOCUMENTS

| GB | 2347520 | 6/2000 |
| WO | 2007011790 | 1/2007 |

OTHER PUBLICATIONS

Buller et al., "Opportunites and challenges in asymmetric device implementation", IEEE, Custom Integrated Circuits Conference, 2004, pp. 229-232 See Priority U.S. Appl. No. 16/853,875, filed Apr. 21, 2020.
(Continued)

*Primary Examiner* — Shahed Ahmed
(74) *Attorney, Agent, or Firm* — ALLEN, DYER, DOPPELT + GILCHRIST, P.A.

(57) ABSTRACT

A semiconductor device may include a substrate and spaced apart first and second doped regions in the substrate. The first doped region may be larger than the second doped region to define an asymmetric channel therebetween. The semiconductor device may further include a superlattice extending between the first and second doped regions to constrain dopant therein. The superlattice may include a plurality of stacked groups of layers, with each group of layers comprising a plurality of stacked base semiconductor monolayers defining a base semiconductor portion, and at least one non-semiconductor monolayer constrained within a crystal lattice of adjacent base semiconductor portions. A gate may overly the asymmetric channel.

17 Claims, 16 Drawing Sheets

Related U.S. Application Data division of application No. 16/853,875, filed on Apr. 21, 2020, now Pat. No. 11,329,154.

(60) Provisional application No. 62/959,271, filed on Jan. 10, 2020, provisional application No. 62/837,342, filed on Apr. 23, 2019.

(51) Int. Cl.
  *H01L 29/10* (2006.01)
  *H01L 29/15* (2006.01)
  *H01L 29/66* (2006.01)

(52) U.S. Cl.
  CPC ...... *H01L 29/152* (2013.01); *H01L 29/66659* (2013.01); *H01L 29/7835* (2013.01)

(58) Field of Classification Search
  CPC ............... H01L 29/086; H01L 29/0623; H01L 29/1054; H01L 29/78624; H01L 29/122–158; H01L 33/04–06; H01L 31/035236–035263; H01L 29/36–365; H01L 29/66568–66659; H01L 29/7816–7826; H01L 29/66681–66704
  See application file for complete search history.

(56) References Cited

U.S. PATENT DOCUMENTS

| | | |
|---|---|---|
| 5,357,119 A | 10/1994 | Wang et al. |
| 5,683,934 A | 11/1997 | Candelaria |
| 5,796,119 A | 8/1998 | Seabaugh |
| 6,141,361 A | 10/2000 | Mears et al. |
| 6,376,337 B1 | 4/2002 | Wang et al. |
| 6,472,685 B2 | 10/2002 | Takagi |
| 6,741,624 B2 | 5/2004 | Mears et al. |
| 6,830,964 B1 | 12/2004 | Mears et al. |
| 6,833,294 B1 | 12/2004 | Mears et al. |
| 6,878,576 B1 | 4/2005 | Mears et al. |
| 6,891,188 B2 | 5/2005 | Mears et al. |
| 6,897,472 B2 | 5/2005 | Mears et al. |
| 6,927,413 B2 | 8/2005 | Mears et al. |
| 6,952,018 B2 | 10/2005 | Mears et al. |
| 6,958,486 B2 | 10/2005 | Mears et al. |
| 6,993,222 B2 | 1/2006 | Mears et al. |
| 7,018,900 B2 | 3/2006 | Kreps |
| 7,033,437 B2 | 4/2006 | Mears et al. |
| 7,034,329 B2 | 4/2006 | Mears et al. |
| 7,045,377 B2 | 5/2006 | Mears et al. |
| 7,045,813 B2 | 5/2006 | Mears et al. |
| 7,071,119 B2 | 7/2006 | Mears et al. |
| 7,105,895 B2 | 9/2006 | Wang et al. |
| 7,109,052 B2 | 9/2006 | Mears et al. |
| 7,123,792 B1 | 10/2006 | Mears et al. |
| 7,148,712 B1 | 12/2006 | Prey, Jr. et al. |
| 7,153,763 B2 | 12/2006 | Hytha et al. |
| 7,202,494 B2 | 4/2007 | Blanchard et al. |
| 7,227,174 B2 | 6/2007 | Mears et al. |
| 7,229,902 B2 | 6/2007 | Mears et al. |
| 7,265,002 B2 | 9/2007 | Mears et al. |
| 7,279,699 B2 | 10/2007 | Mears et al. |
| 7,279,701 B2 | 10/2007 | Kreps |
| 7,288,457 B2 | 10/2007 | Kreps |
| 7,303,948 B2 | 12/2007 | Mears et al. |
| 7,432,524 B2 | 10/2008 | Mears et al. |
| 7,435,988 B2 | 10/2008 | Mears et al. |
| 7,436,026 B2 | 10/2008 | Kreps |
| 7,446,002 B2 | 11/2008 | Mears et al. |
| 7,446,334 B2 | 11/2008 | Mears et al. |
| 7,491,587 B2 | 2/2009 | Rao |
| 7,514,328 B2 | 4/2009 | Rao |
| 7,517,702 B2 | 4/2009 | Halilov et al. |
| 7,531,828 B2 | 5/2009 | Mears et al. |
| 7,531,829 B2 | 5/2009 | Blanchard |
| 7,531,850 B2 | 5/2009 | Blanchard |
| 7,586,116 B2 | 9/2009 | Kreps et al. |
| 7,586,165 B2 | 9/2009 | Blanchard |
| 7,598,515 B2 | 10/2009 | Mears et al. |
| 7,612,366 B2 | 11/2009 | Mears et al. |
| 7,625,767 B2 | 12/2009 | Huang et al. |
| 7,659,539 B2 | 2/2010 | Kreps et al. |
| 7,700,447 B2 | 4/2010 | Dukovski et al. |
| 7,718,996 B2 | 5/2010 | Dukovski et al. |
| 7,781,827 B2 | 8/2010 | Rao |
| 7,812,339 B2 | 10/2010 | Mears et al. |
| 7,863,066 B2 | 1/2011 | Mears et al. |
| 7,880,161 B2 | 2/2011 | Mears et al. |
| 7,928,425 B2 | 4/2011 | Rao |
| 8,389,974 B2 | 3/2013 | Mears et al. |
| 9,275,996 B2 | 3/2016 | Mears et al. |
| 9,406,753 B2 | 8/2016 | Mears et al. |
| 9,558,939 B1 | 1/2017 | Stephenson et al. |
| 9,899,479 B2 | 2/2018 | Mears et al. |
| 9,941,359 B2 | 4/2018 | Mears et al. |
| 9,972,685 B2 | 5/2018 | Mears et al. |
| 10,084,045 B2 | 9/2018 | Mears et al. |
| 10,107,854 B2 | 10/2018 | Roy |
| 10,109,342 B2 | 10/2018 | Roy |
| 10,109,479 B1 | 10/2018 | Mears et al. |
| 10,170,560 B2 | 1/2019 | Mears |
| 10,170,603 B2 | 1/2019 | Mears et al. |
| 10,170,604 B2 | 1/2019 | Mears et al. |
| 10,191,105 B2 | 1/2019 | Roy |
| 10,249,745 B2 | 4/2019 | Mears et al. |
| 10,276,625 B1 | 4/2019 | Mears et al. |
| 10,304,881 B1 | 5/2019 | Chen et al. |
| 10,355,151 B2 | 7/2019 | Chen et al. |
| 10,361,243 B2 | 7/2019 | Mears et al. |
| 10,367,028 B2 | 7/2019 | Chen et al. |
| 10,367,064 B2 | 7/2019 | Rao |
| 10,381,242 B2 | 8/2019 | Takeuchi |
| 10,396,223 B2 | 8/2019 | Chen et al. |
| 10,410,880 B2 | 9/2019 | Takeuchi |
| 10,453,945 B2 | 10/2019 | Mears et al. |
| 10,461,118 B2 | 10/2019 | Chen et al. |
| 10,468,245 B2 | 11/2019 | Weeks et al. |
| 10,529,757 B2 | 1/2020 | Chen et al. |
| 10,529,768 B2 | 1/2020 | Chen et al. |
| 10,566,191 B1 | 2/2020 | Weeks et al. |
| 10,580,866 B1 | 3/2020 | Takeuchi et al. |
| 10,580,867 B1 | 3/2020 | Takeuchi et al. |
| 10,593,761 B1 | 3/2020 | Takeuchi et al. |
| 10,608,027 B2 | 3/2020 | Chen et al. |
| 10,608,043 B2 | 3/2020 | Chen et al. |
| 10,615,209 B2 | 4/2020 | Chen et al. |
| 2003/0022430 A1* | 1/2003 | Emrick ............ H01L 29/66848 257/E21.12 |
| 2003/0034529 A1 | 2/2003 | Fitzgerald et al. |
| 2003/0057416 A1 | 3/2003 | Currie et al. |
| 2005/0282330 A1 | 12/2005 | Mears et al. |
| 2006/0220118 A1 | 1/2006 | Stephenson et al. |
| 2006/0267130 A1 | 11/2006 | Rao |
| 2006/0273299 A1* | 12/2006 | Stephenson ........... H01L 29/155 257/15 |
| 2007/0012910 A1 | 1/2007 | Mears et al. |
| 2007/0020833 A1 | 1/2007 | Mears et al. |
| 2007/0063185 A1* | 3/2007 | Rao ....................... H01L 29/152 257/18 |
| 2007/0063186 A1 | 3/2007 | Rao |
| 2008/0012004 A1 | 1/2008 | Huang et al. |
| 2008/0258134 A1 | 10/2008 | Mears et al. |
| 2011/0215299 A1* | 9/2011 | Rao ..................... H01L 29/7833 257/E21.409 |
| 2015/0014706 A1* | 1/2015 | Sadwick ............ H01L 29/7802 257/77 |
| 2015/0357414 A1 | 12/2015 | Mears |
| 2016/0149023 A1 | 5/2016 | Mears et al. |
| 2016/0181420 A1* | 6/2016 | Imthurn ............ H01L 29/66674 257/336 |
| 2016/0336406 A1 | 11/2016 | Mears et al. |
| 2016/0358773 A1 | 12/2016 | Mears et al. |
| 2017/0170311 A1* | 6/2017 | Huo ..................... H01L 29/0847 |
| 2017/0200823 A1 | 7/2017 | Kang et al. |
| 2018/0358361 A1 | 12/2018 | Rao |

(56) References Cited

U.S. PATENT DOCUMENTS

| | | |
|---|---|---|
| 2019/0057896 A1 | 2/2019 | Stephenson et al. |
| 2019/0058059 A1 | 2/2019 | Stephenson et al. |
| 2019/0189652 A1 | 6/2019 | Chen et al. |
| 2019/0279869 A1 | 9/2019 | Weeks et al. |
| 2019/0279897 A1 | 9/2019 | Stephenson et al. |
| 2019/0280090 A1 | 9/2019 | Stephenson et al. |
| 2019/0317277 A1 | 10/2019 | Stephenson |
| 2019/0319135 A1 | 10/2019 | Stephenson |
| 2019/0319136 A1 | 10/2019 | Stephenson |
| 2019/0319167 A1 | 10/2019 | Stephenson |
| 2020/0075731 A1 | 3/2020 | Weeks et al. |

OTHER PUBLICATIONS

U.S. Appl. No. 16/176,005, filed Oct. 31, 2018 Weeks et al. See Priority U.S. Appl. No. 16/853,875, filed Apr. 21, 2020.

U.S. Appl. No. 16/192,897, filed Nov. 16, 2018 Connelly et al. See Priority U.S. Appl. No. 16/853,875, filed Apr. 21, 2020.

U.S. Appl. No. 16/192,911, filed Nov. 16, 2018 Takeuchi et al. See Priority U.S. Appl. No. 16/853,875, filed Apr. 21, 2020.

U.S. Appl. No. 16/192,923, filed Nov. 16, 2018 Takeuchi et al. See Priority U.S. Appl. No. 16/853,875, filed Apr. 21, 2020.

U.S. Appl. No. 16/192,987, filed Nov. 16, 2018 Takeuchi et al. See Priority U.S. Appl. No. 16/853,875, filed Apr. 21, 2020.

U.S. Appl. No. 16/193,000, filed Nov. 16, 2018 Takeuchi et al. See Priority U.S. Appl. No. 16/853,875, filed Apr. 21, 2020.

U.S. Appl. No. 16/193,011, filed Nov. 16, 2018 Takeuchi et al. See Priority U.S. Appl. No. 16/853,875, filed Apr. 21, 2020.

U.S. Appl. No. 16/513,528, filed 17/17/2019; Burton et al. See Priority U.S. Appl. No. 16/853,875, filed Apr. 21, 2020.

U.S. Appl. No. 16/513,832, filed 17/17/2019 Burton et al. See Priority U.S. Appl. No. 16/853,875, filed Apr. 21, 2020.

U.S. Appl. No. 16/513,845, filed 17/17/2019 Burton et al. See Priority U.S. Appl. No. 16/853,875, filed Apr. 21, 2020.

U.S. Appl. No. 16/513,875, filed 17/17/2019 Burton et al. See Priority U.S. Appl. No. 16/853,875, filed Apr. 21, 2020.

U.S. Appl. No. 16/513,895, filed 17/17/2019 Burton et al. See Priority U.S. Appl. No. 16/853,875, filed Apr. 21, 2020.

U.S. Appl. No. 16/513,906, filed 17/17/2019 Burton et al. See Priority U.S. Appl. No. 16/853,875, filed Apr. 21, 2020.

U.S. Appl. No. 16/513,932, filed 17/17/2019 Burton et al. See Priority U.S. Appl. No. 16/853,875, filed Apr. 21, 2020.

U.S. Appl. No. 16/513,943, filed 17/17/2019 Burton et al. See Priority U.S. Appl. No. 16/853,875, filed Apr. 21, 2020.

U.S. Appl. No. 16/801,287, filed Feb. 26, 2020 Weeks et al. See Priority U.S. Appl. No. 16/853,875, filed Apr. 21, 2020.

U.S. Appl. No. 16/801,305, filed Feb. 26, 2020 Weeks et al. See Priority U.S. Appl. No. 16/853,875, filed Apr. 21, 2020.

U.S. Appl. No. 16/810,957, filed Mar. 6, 2020 Cody et al. See Priority U.S. Appl. No. 16/853,875, filed Apr. 21, 2020.

U.S. Appl. No. 16/853,884, filed Apr. 21, 2020 Hideki Takeuchi See Priority U.S. Appl. No. 16/853,875, filed Apr. 21, 2020.

Luo et al., "Chemical Design of Direct-Gap Light-Emitting Silicon" published in Physical Review Letters, vol. 89, No. 7; Aug. 12, 2002; 4 pgs. See Priority U.S. Appl. No. 16/853,875, filed Apr. 21, 2020.

Mears et al. "Simultaneous Carrier Transport Enhancement and variability reduction in Si MOSFETs by insertion of partial Monolayers of oxygen" IEEE silicon Nanoelectronics Workshop (2012): (Date of conference Jun. 10-11, 2012) pp. 2. See Priority U.S. Appl. No. 16/853,875, filed Apr. 21, 2020.

Novikov et al. "Silicon-based Optoelectronics" 1999-2003, pp. 1-6. See Priority U.S. Appl. No. 16/853,875, filed Apr. 21, 2020.

R. Tsu "Phenomena in silicon nanostructure device" published online Sep. 6, 2000 by Applied Physics and Materials Science & Processing, pp. 391-402 See Priority U.S. Appl. No. 16/853,875, filed Apr. 21, 2020.

R. Tsu "Si Based Green ELD: Si-Oxygen Superlattice" wysiwyg://l/http://www3.interscience.wiley.com/cgi-bin/abstract/72512946/start: published online Jul. 21, 2000; 2 pgs. Abstract Only. See Priority U.S. Appl. No. 16/853,875, filed Apr. 21, 2020.

Xu et al. "Effectiveness of Quasi-confinement technology for improving P-chanel Si an Ge MOSSFET performance" Department of Electrical Engineering and Computer Science, University of California, Berkeley, 2012, pp. 2. mearstech.net; retrieved from internet Jan. 18, 2016. See Priority U.S. Appl. No. 16/853,875, filed Apr. 21, 2020.

Xu et al. "Extension of planar bulk n-channel MOSFET scaling with oxygen insertion technology" IEEE Transactions on Electron devices, vol. 61, No. 9; Sep. 2014. pp. 3345-3349. See Priority U.S. Appl. No. 16/853,875, filed Apr. 21, 2020.

Xu et al., "MOSFET performance and scalability enhancement by insertion of oxygen layers", Department of Electrical Engineering and Computer Science, University of California, Berkeley, 2012, pp. 1-4. See Priority U.S. Appl. No. 16/853,875, filed Apr. 21, 2020.

\* cited by examiner

SEMICONDUCTOR DEVICE INCLUDING A SUPERLATTICE AND AN ASYMMETRIC CHANNEL AND RELATED METHODS

CROSS-REFERENCE TO RELATED APPLICATIONS

This application is a continuation of Ser. No. 17/719,242 filed Apr. 12, 2022, which is a divisional of Ser. No. 16/853,875 filed Apr. 21, 2020, now U.S. Pat. No. 11,329,154, issued May 10, 2022, and claims the benefit of U.S. provisional application Nos. 62/837,342 filed Apr. 23, 2019, and 62/959,271 filed Jan. 10, 2020, all of which are hereby incorporated herein in their entireties by reference.

TECHNICAL FIELD

The present disclosure generally relates to semiconductor devices and, more particularly, to a semiconductor device with enhanced channel structures and related methods.

BACKGROUND

Structures and techniques have been proposed to enhance the performance of semiconductor devices, such as by enhancing the mobility of the charge carriers. For example, U.S. Patent Application No. 2003/0057416 to Currie et al. discloses strained material layers of silicon, silicon-germanium, and relaxed silicon and also including impurity-free zones that would otherwise cause performance degradation. The resulting biaxial strain in the upper silicon layer alters the carrier mobilities enabling higher speed and/or lower power devices. Published U.S. Patent Application No. 2003/0034529 to Fitzgerald et al. discloses a CMOS inverter also based upon similar strained silicon technology.

U.S. Pat. No. 6,472,685 B2 to Takagi discloses a semiconductor device including a silicon and carbon layer sandwiched between silicon layers so that the conduction band and valence band of the second silicon layer receive a tensile strain. Electrons having a smaller effective mass, and which have been induced by an electric field applied to the gate electrode, are confined in the second silicon layer, thus, an re-channel MOSFET is asserted to have a higher mobility.

U.S. Pat. No. 4,937,204 to Ishibashi et al. discloses a superlattice in which a plurality of layers, less than eight monolayers, and containing a fractional or binary or a binary compound semiconductor layer, are alternately and epitaxially grown. The direction of main current flow is perpendicular to the layers of the superlattice.

U.S. Pat. No. 5,357,119 to Wang et al. discloses a Si—Ge short period superlattice with higher mobility achieved by reducing alloy scattering in the superlattice. Along these lines, U.S. Pat. No. 5,683,934 to Candelaria discloses an enhanced mobility MOSFET including a channel layer comprising an alloy of silicon and a second material substitutionally present in the silicon lattice at a percentage that places the channel layer under tensile stress.

U.S. Pat. No. 5,216,262 to Tsu discloses a quantum well structure comprising two barrier regions and a thin epitaxially grown semiconductor layer sandwiched between the barriers. Each barrier region consists of alternate layers of SiO2/Si with a thickness generally in a range of two to six monolayers. A much thicker section of silicon is sandwiched between the barriers.

An article entitled "Phenomena in silicon nanostructure devices" also to Tsu and published online Sep. 6, 2000 by Applied Physics and Materials Science & Processing, pp. 391-402 discloses a semiconductor-atomic superlattice (SAS) of silicon and oxygen. The Si/O superlattice is disclosed as useful in a silicon quantum and light-emitting devices. In particular, a green electroluminescence diode structure was constructed and tested. Current flow in the diode structure is vertical, that is, perpendicular to the layers of the SAS. The disclosed SAS may include semiconductor layers separated by adsorbed species such as oxygen atoms, and CO molecules. The silicon growth beyond the adsorbed monolayer of oxygen is described as epitaxial with a fairly low defect density. One SAS structure included a 1.1 nm thick silicon portion that is about eight atomic layers of silicon, and another structure had twice this thickness of silicon. An article to Luo et al. entitled "Chemical Design of Direct-Gap Light-Emitting Silicon" published in Physical Review Letters, Vol. 89, No. 7 (Aug. 12, 2002) further discusses the light emitting SAS structures of Tsu.

U.S. Pat. No. 7,105,895 to Wang et al. discloses a barrier building block of thin silicon and oxygen, carbon, nitrogen, phosphorous, antimony, arsenic or hydrogen to thereby reduce current flowing vertically through the lattice more than four orders of magnitude. The insulating layer/barrier layer allows for low defect epitaxial silicon to be deposited next to the insulating layer.

Published Great Britain Patent Application 2,347,520 to Mears et al. discloses that principles of Aperiodic Photonic Band-Gap (APBG) structures may be adapted for electronic bandgap engineering. In particular, the application discloses that material parameters, for example, the location of band minima, effective mass, etc., can be tailored to yield new aperiodic materials with desirable band-structure characteristics. Other parameters, such as electrical conductivity, thermal conductivity and dielectric permittivity or magnetic permeability are disclosed as also possible to be designed into the material.

Furthermore, U.S. Pat. No. 6,376,337 to Wang et al. discloses a method for producing an insulating or barrier layer for semiconductor devices which includes depositing a layer of silicon and at least one additional element on the silicon substrate whereby the deposited layer is substantially free of defects such that epitaxial silicon substantially free of defects can be deposited on the deposited layer. Alternatively, a monolayer of one or more elements, preferably comprising oxygen, is absorbed on a silicon substrate. A plurality of insulating layers sandwiched between epitaxial silicon forms a barrier composite.

Despite the existence of such approaches, further enhancements may be desirable for using advanced semiconductor materials and processing techniques to achieve improved performance in semiconductor devices.

SUMMARY

A semiconductor device may include a substrate and spaced apart first and second doped regions in the substrate. The first doped region may be larger than the second doped region to define an asymmetric channel therebetween. The semiconductor device may further include a superlattice extending between the first and second doped regions to constrain dopant therein. The superlattice may include a plurality of stacked groups of layers, with each group of layers comprising a plurality of stacked base semiconductor monolayers defining a base semiconductor portion, and at least one non-semiconductor monolayer constrained within a crystal lattice of adjacent base semiconductor portions. A gate may overly the asymmetric channel.

In an example embodiment, the first region may comprise a drain region, and the second region may comprise a source region. The superlattice may overlie at least part of the first doped region. Furthermore, the asymmetric channel may be at least partially within the superlattice in some embodiments. In other example embodiments, the semiconductor device may further include a punch through stop implant in the substrate beneath the asymmetric channel.

The first and second doped regions may have a first conductivity type, and the semiconductor device may further include a well implant constrained within the substrate by the superlattice adjacent the second doped region and having a second conductivity type different than the first conductivity type. More particularly, the first doped region may extend laterally beneath the gate beyond a center of the asymmetric channel.

By way of example, the gate may comprise a gate dielectric overlying the superlattice, and a gate electrode overlying the gate dielectric layer. The semiconductor device may further include sidewall spacers on the substrate laterally adjacent the gate. By way of example, the base semiconductor monolayers may comprise silicon monolayers, and the at least one non-semiconductor monolayer may comprise oxygen.

DETAILED DESCRIPTION

Figure 1:
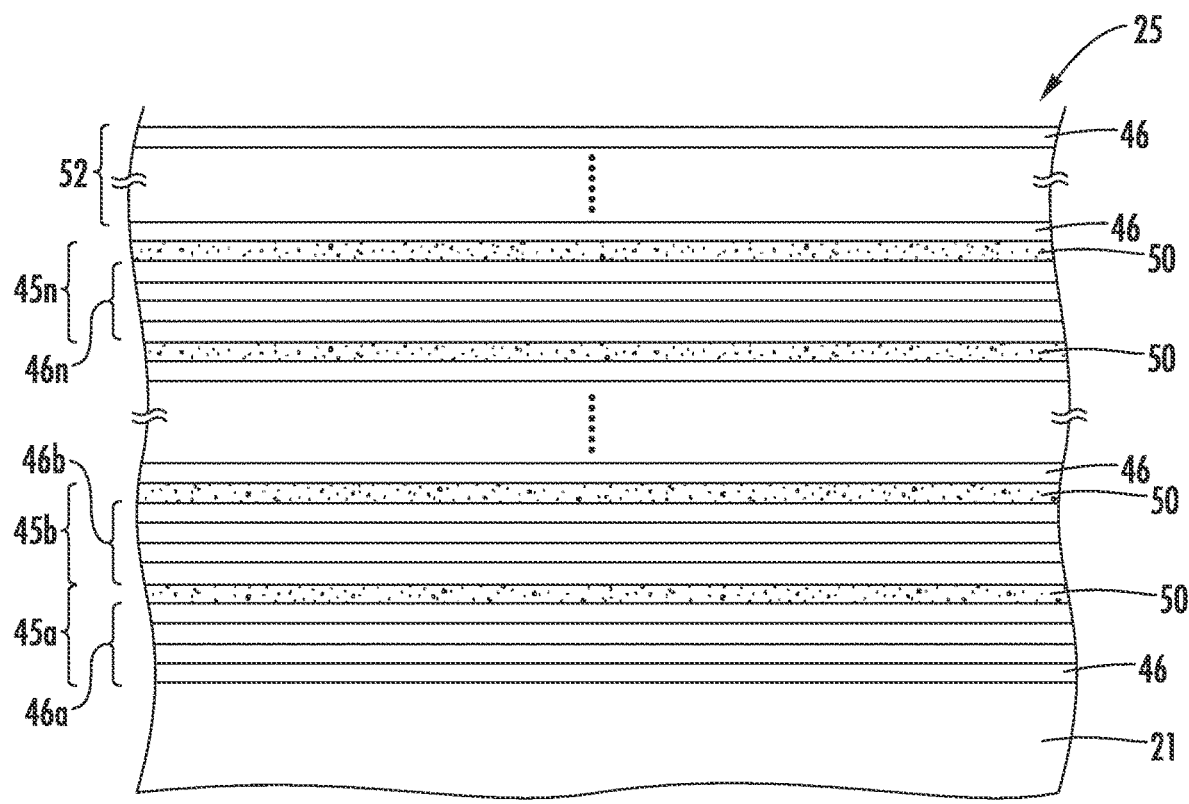
FIG. 1 is a greatly enlarged schematic cross-sectional view of a superlattice for use in a semiconductor device in accordance with an example embodiment.

Example embodiments will now be described more fully hereinafter with reference to the accompanying drawings, in which the example embodiments are shown. The embodiments may, however, be implemented in many different forms and should not be construed as limited to the specific examples set forth herein. Rather, these embodiments are provided so that this disclosure will be thorough and complete. Like numbers refer to like elements throughout, and prime and multiple prime notation are used to indicate similar elements in different embodiments.

Generally speaking, the present disclosure relates to the formation of semiconductor devices utilizing an enhanced semiconductor superlattice to provide an asymmetric channel through accurate dopant diffusion control. The enhanced semiconductor superlattice is also referred to as an "MST" layer or "MST technology" in this disclosure.

More particularly, the MST technology relates to advanced semiconductor materials such as the superlattice 25 described further below. Applicant theorizes, without wishing to be bound thereto, that certain superlattices as described herein reduce the effective mass of charge carriers and that this thereby leads to higher charge carrier mobility. Effective mass is described with various definitions in the literature. As a measure of the improvement in effective mass Applicant's use a "conductivity reciprocal effective mass tensor", $M_e^{-1}$ and $M_h^{-1}$ for electrons and holes respectively, defined as:

$$M_{e,ij}^{-1}(E_F, T) = \frac{\sum_{E>E_F} \int_{B.Z.} (\nabla_k E(k, n))_i (\nabla_k E(k, n))_j \frac{\partial f(E(k, n), E_F, T)}{\partial E} d^3k}{\sum_{E>E_F} \int_{B.Z.} f(E(k, n), E_F, T) d^3k}$$

for electrons and:

$$M_{h,ij}^{-1}(E_F, T) = \frac{-\sum_{E<E_F} \int_{B.Z.} (\nabla_k E(k, n))_i (\nabla_k E(k, n))_j \frac{\partial f(E(k, n), E_F, T)}{\partial E} d^3k}{\sum_{E<E_F} \int_{B.Z.} (1 - f(E(k, n), E_F, T)) d^3k}$$

for holes, where f is the Fermi-Dirac distribution, $E_F$ is the Fermi energy, T is the temperature, E(k,n) is the energy of an electron in the state corresponding to wave vector k and the $n^{th}$ energy band, the indices i and j refer to Cartesian coordinates x, y and z, the integrals are taken over the Brillouin zone (B.Z.), and the summations are taken over bands with energies above and below the Fermi energy for electrons and holes respectively.

Applicant's definition of the conductivity reciprocal effective mass tensor is such that a tensorial component of the conductivity of the material is greater for greater values of the corresponding component of the conductivity reciprocal effective mass tensor. Again, Applicant theorizes without wishing to be bound thereto that the superlattices described herein set the values of the conductivity reciprocal effective mass tensor so as to enhance the conductive properties of the material, such as typically for a preferred direction of charge carrier transport. The inverse of the appropriate tensor element is referred to as the conductivity effective mass. In other words, to characterize semiconductor material structures, the conductivity effective mass for electrons/holes as described above and calculated in the direction of intended carrier transport is used to distinguish improved materials.

Applicant has identified improved materials or structures for use in semiconductor devices. More specifically, Applicant has identified materials or structures having energy band structures for which the appropriate conductivity effective masses for electrons and/or holes are substantially less than the corresponding values for silicon. In addition to the enhanced mobility characteristics of these structures, they may also be formed or used in such a manner that they provide piezoelectric, pyroelectric, and/or ferroelectric properties that are advantageous for use in a variety of different types of devices, as will be discussed further below.

Figure 2:
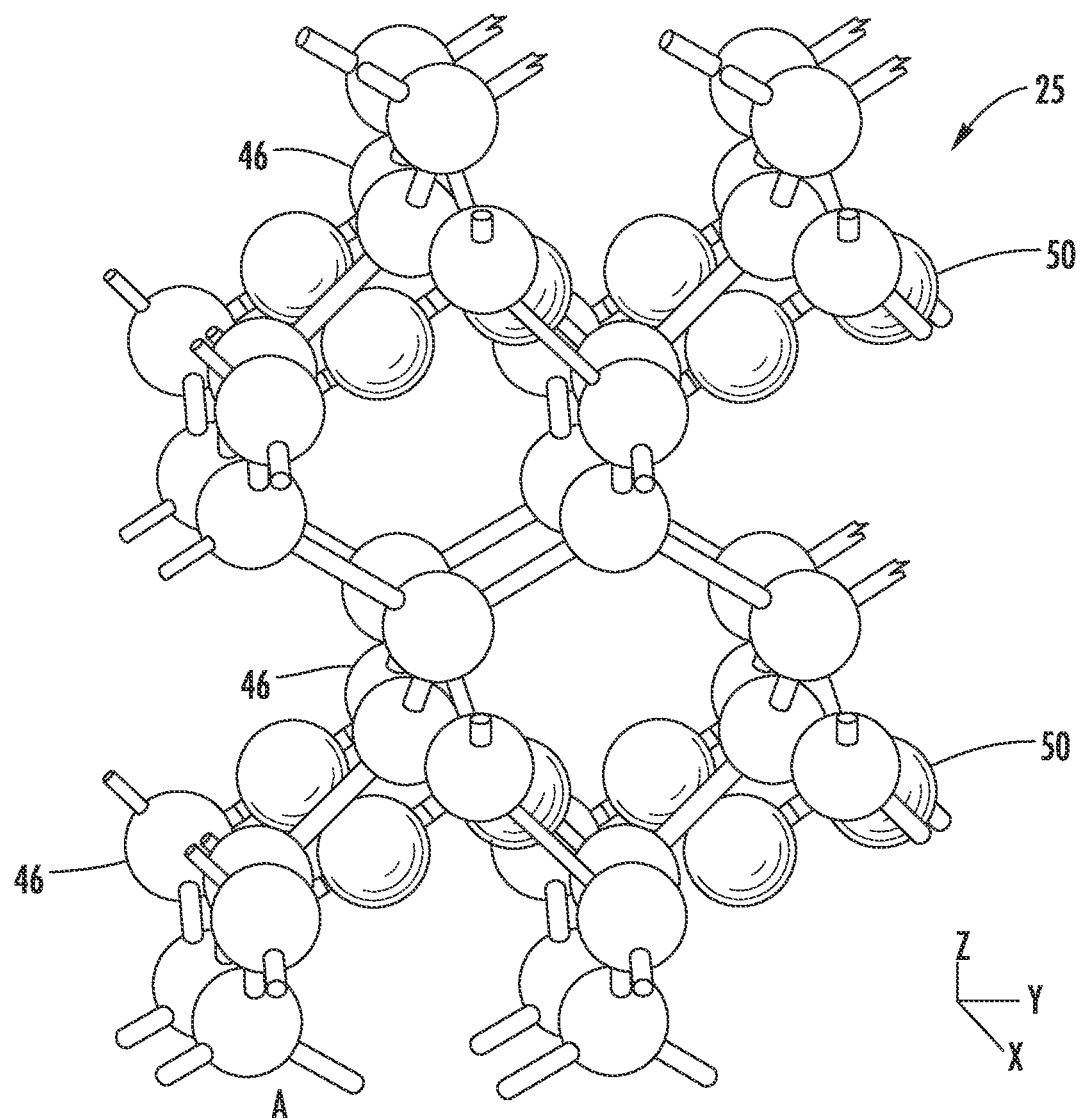
FIG. 2 is a perspective schematic atomic diagram of a portion of the superlattice shown in FIG. 1.

Referring now to FIGS. 1 and 2, the materials or structures are in the form of a superlattice 25 whose structure is controlled at the atomic or molecular level and may be formed using known techniques of atomic or molecular layer deposition. The superlattice 25 includes a plurality of layer groups 45$a$-45$n$ arranged in stacked relation, as perhaps best understood with specific reference to the schematic cross-sectional view of FIG. 1.

Each group of layers 45$a$-45$n$ of the superlattice 25 illustratively includes a plurality of stacked base semiconductor monolayers 46 defining a respective base semiconductor portion 46$a$-46$n$ and an energy band-modifying layer 50 thereon. The energy band-modifying layers 50 are indicated by stippling in FIG. 1 for clarity of illustration.

The energy band-modifying layer 50 illustratively includes one non-semiconductor monolayer constrained within a crystal lattice of adjacent base semiconductor portions. By "constrained within a crystal lattice of adjacent base semiconductor portions" it is meant that at least some semiconductor atoms from opposing base semiconductor portions 46$a$-46$n$ are chemically bound together through the non-semiconductor monolayer 50 therebetween, as seen in FIG. 2. Generally speaking, this configuration is made possible by controlling the amount of non-semiconductor material that is deposited on semiconductor portions 46$a$-46$n$ through atomic layer deposition techniques so that not all (i.e., less than full or 100% coverage) of the available semiconductor bonding sites are populated with bonds to non-semiconductor atoms, as will be discussed further below. Thus, as further monolayers 46 of semiconductor material are deposited on or over a non-semiconductor monolayer 50, the newly deposited semiconductor atoms will populate the remaining vacant bonding sites of the semiconductor atoms below the non-semiconductor monolayer.

In other embodiments, more than one such non-semiconductor monolayer may be possible. It should be noted that reference herein to a non-semiconductor or semiconductor monolayer means that the material used for the monolayer would be a non-semiconductor or semiconductor if formed in bulk. That is, a single monolayer of a material, such as silicon, may not necessarily exhibit the same properties that it would if formed in bulk or in a relatively thick layer, as will be appreciated by those skilled in the art.

Applicant theorizes without wishing to be bound thereto that energy band-modifying layers 50 and adjacent base semiconductor portions 46$a$-46$n$ cause the superlattice 25 to have a lower appropriate conductivity effective mass for the charge carriers in the parallel layer direction than would otherwise be present. Considered another way, this parallel direction is orthogonal to the stacking direction. The band modifying layers 50 may also cause the superlattice 25 to have a common energy band structure, while also advantageously functioning as an insulator between layers or regions vertically above and below the superlattice.

Moreover, this superlattice structure may also advantageously act as a barrier to dopant and/or material diffusion between layers vertically above and below the superlattice 25. These properties may thus advantageously allow the superlattice 25 to provide an interface for high-K dielectrics which not only reduces diffusion of the high-K material into the channel region, but which may also advantageously reduce unwanted scattering effects and improve device mobility, as will be appreciated by those skilled in the art.

It is also theorized that semiconductor devices including the superlattice 25 may enjoy a higher charge carrier mobility based upon the lower conductivity effective mass than would otherwise be present. In some embodiments, and as a result of the band engineering achieved by the present invention, the superlattice 25 may further have a substantially direct energy bandgap that may be particularly advantageous for opto-electronic devices, for example.

The superlattice 25 also illustratively includes a cap layer 52 on an upper layer group 45$n$. The cap layer 52 may comprise a plurality of base semiconductor monolayers 46. The cap layer 52 may have between 2 to 100 monolayers of the base semiconductor, and, more preferably between 10 to 50 monolayers.

Each base semiconductor portion 46$a$-46$n$ may comprise a base semiconductor selected from the group consisting of Group IV semiconductors, Group III-V semiconductors, and Group II-VI semiconductors. Of course, the term Group IV semiconductors also includes Group IV-IV semiconductors, as will be appreciated by those skilled in the art. More particularly, the base semiconductor may comprise at least one of silicon and germanium, for example.

Each energy band-modifying layer 50 may comprise a non-semiconductor selected from the group consisting of oxygen, nitrogen, fluorine, carbon and carbon-oxygen, for example. The non-semiconductor is also desirably thermally stable through deposition of a next layer to thereby facilitate manufacturing. In other embodiments, the non-semiconductor may be another inorganic or organic element or compound that is compatible with the given semiconductor processing as will be appreciated by those skilled in the art. More particularly, the base semiconductor may comprise at least one of silicon and germanium, for example It should be noted that the term monolayer is meant to include a single atomic layer and also a single molecular layer. It is also noted that the energy band-modifying layer 50 provided by a single monolayer is also meant to include a monolayer wherein not all of the possible sites are occupied (i.e., there is less than full or 100% coverage). For example, with particular reference to the atomic diagram of FIG. 2, a 4/1 repeating structure is illustrated for silicon as the base semiconductor material, and oxygen as the energy band-modifying material. Only half of the possible sites for oxygen are occupied in the illustrated example.

In other embodiments and/or with different materials this one-half occupation would not necessarily be the case as will be appreciated by those skilled in the art. Indeed, it can be seen even in this schematic diagram, that individual atoms of oxygen in a given monolayer are not precisely aligned along a flat plane as will also be appreciated by those of skill in the art of atomic deposition. By way of example, a preferred occupation range is from about one-eighth to one-half of the possible oxygen sites being full, although other numbers may be used in certain embodiments.

Silicon and oxygen are currently widely used in conventional semiconductor processing, and, hence, manufacturers will be readily able to use these materials as described herein. Atomic or monolayer deposition is also now widely used. Accordingly, semiconductor devices incorporating the superlattice 25 in accordance with the invention may be readily adopted and implemented, as will be appreciated by those skilled in the art.

It is theorized without Applicant wishing to be bound thereto that for a superlattice, such as the Si/O superlattice, for example, that the number of silicon monolayers should desirably be seven or less so that the energy band of the superlattice is common or relatively uniform throughout to achieve the desired advantages. The 4/1 repeating structure shown in FIGS. 1 and 2, for Si/O has been modeled to indicate an enhanced mobility for electrons and holes in the X direction. For example, the calculated conductivity effective mass for electrons (isotropic for bulk silicon) is 0.26 and for the 4/1 SiO superlattice in the X direction it is 0.12 resulting in a ratio of 0.46. Similarly, the calculation for holes yields values of 0.36 for bulk silicon and 0.16 for the 4/1 Si/O superlattice resulting in a ratio of 0.44.

While such a directionally preferential feature may be desired in certain semiconductor devices, other devices may benefit from a more uniform increase in mobility in any direction parallel to the groups of layers. It may also be beneficial to have an increased mobility for both electrons and holes, or just one of these types of charge carriers as will be appreciated by those skilled in the art.

The lower conductivity effective mass for the 4/1 Si/O embodiment of the superlattice 25 may be less than two-thirds the conductivity effective mass than would otherwise occur, and this applies for both electrons and holes. Of course, the superlattice 25 may further comprise at least one type of conductivity dopant therein, as will also be appreciated by those skilled in the art.

Figure 3:
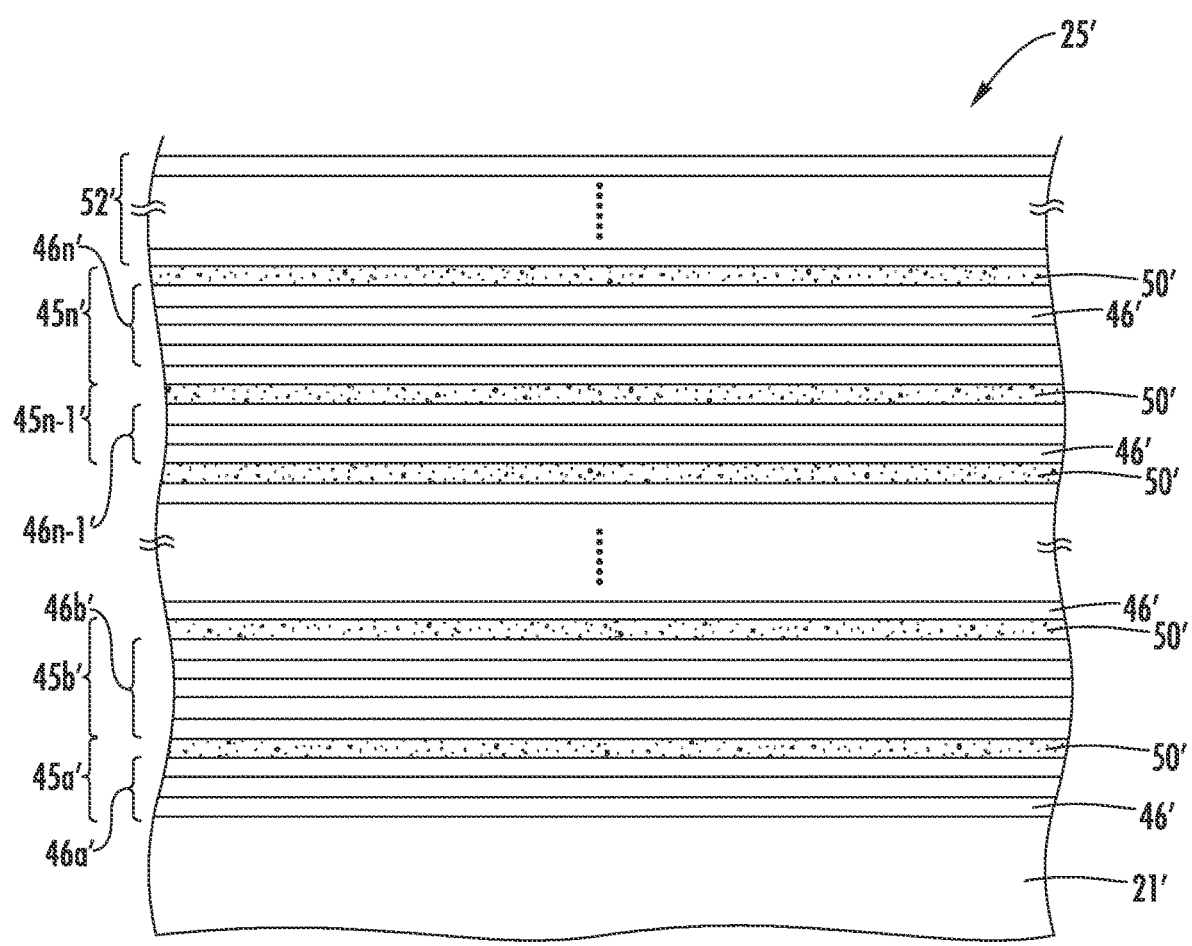
FIG. 3 is a greatly enlarged schematic cross-sectional view of another embodiment of a superlattice in accordance with an example embodiment.

Indeed, referring now additionally to FIG. 3, another embodiment of a superlattice 25' in accordance with the invention having different properties is now described. In this embodiment, a repeating pattern of 3/1/5/1 is illustrated. More particularly, the lowest base semiconductor portion 46a' has three monolayers, and the second lowest base semiconductor portion 46b' has five monolayers. This pattern repeats throughout the superlattice 25'. The energy band-modifying layers 50' may each include a single monolayer. For such a superlattice 25' including Si/O, the enhancement of charge carrier mobility is independent of orientation in the plane of the layers. Those other elements of FIG. 3 not specifically mentioned are similar to those discussed above with reference to FIG. 1 and need no further discussion herein.

In some device embodiments, all of the base semiconductor portions of a superlattice may be a same number of monolayers thick. In other embodiments, at least some of the base semiconductor portions may be a different number of monolayers thick. In still other embodiments, all of the base semiconductor portions may be a different number of monolayers thick.

Figure 4A:
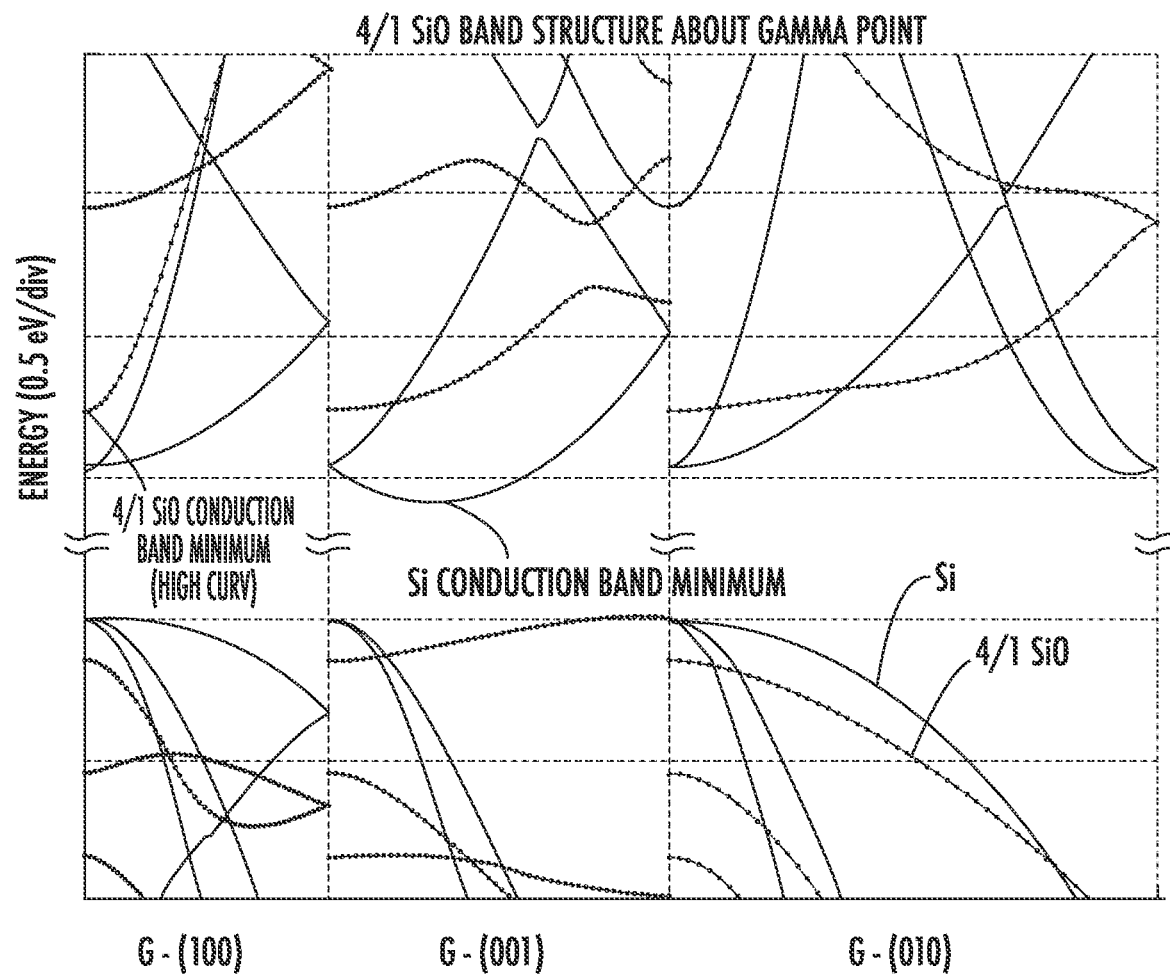
FIG. 4A is a graph of the calculated band structure from the gamma point (G) for both bulk silicon as in the prior art, and for the 4/1 Si/O superlattice as shown in FIGS. 1-2.
Figure 4B:
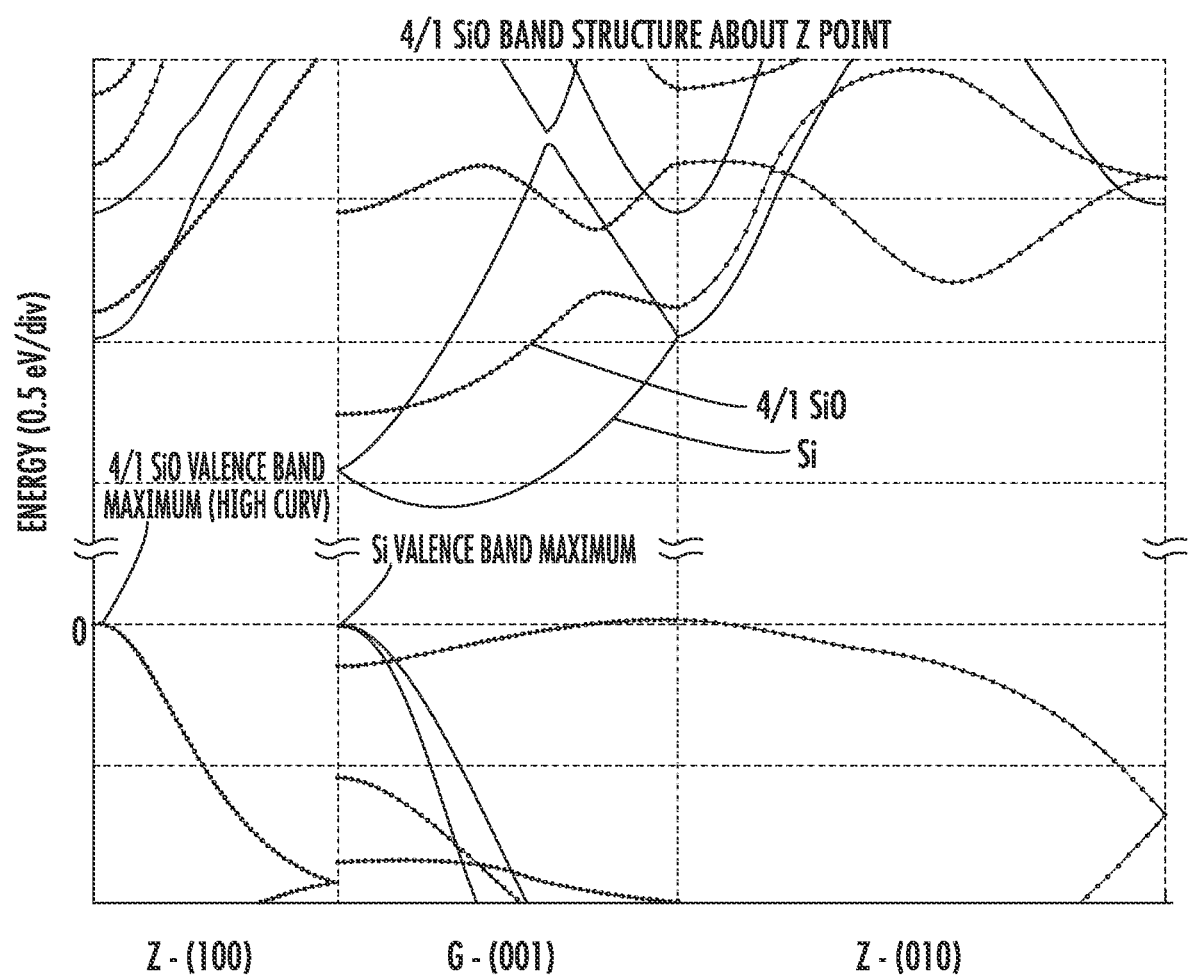
FIG. 4B is a graph of the calculated band structure from the Z point for both bulk silicon as in the prior art, and for the 4/1 Si/O superlattice as shown in FIGS. 1-2.
Figure 4C:
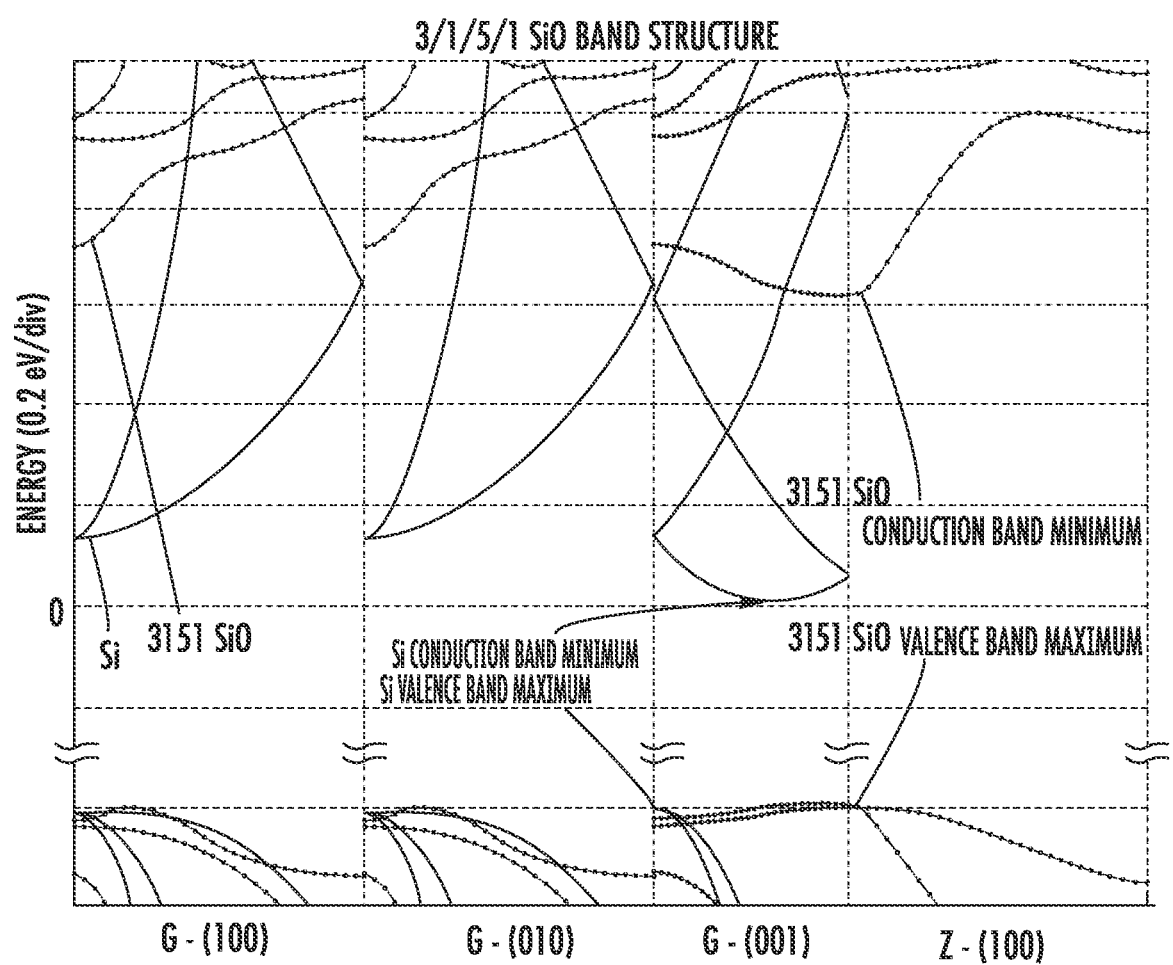
FIG. 4C is a graph of the calculated band structure from both the gamma and Z points for both bulk silicon as in the prior art, and for the 5/1/3/1 Si/O superlattice as shown in FIG. 3.

In FIGS. 4A-4C, band structures calculated using Density Functional Theory (DFT) are presented. It is well known in the art that DFT underestimates the absolute value of the bandgap. Hence all bands above the gap may be shifted by an appropriate "scissors correction." However, the shape of the band is known to be much more reliable. The vertical energy axes should be interpreted in this light.

FIG. 4A shows the calculated band structure from the gamma point (G) for both bulk silicon (represented by continuous lines) and for the 4/1 Si/O superlattice 25 shown in FIG. 1 (represented by dotted lines). The directions refer to the unit cell of the 4/1 Si/O structure and not to the conventional unit cell of Si, although the (001) direction in the figure does correspond to the (001) direction of the conventional unit cell of Si, and, hence, shows the expected location of the Si conduction band minimum. The (100) and (010) directions in the figure correspond to the (110) and (−110) directions of the conventional Si unit cell. Those skilled in the art will appreciate that the bands of Si on the figure are folded to represent them on the appropriate reciprocal lattice directions for the 4/1 Si/O structure.

It can be seen that the conduction band minimum for the 4/1 Si/O structure is located at the gamma point in contrast to bulk silicon (Si), whereas the valence band minimum occurs at the edge of the Brillouin zone in the (001) direction which we refer to as the Z point. One may also note the greater curvature of the conduction band minimum for the 4/1 Si/O structure compared to the curvature of the conduction band minimum for Si owing to the band splitting due to the perturbation introduced by the additional oxygen layer.

FIG. 4B shows the calculated band structure from the Z point for both bulk silicon (continuous lines) and for the 4/1 Si/O superlattice 25 (dotted lines). This figure illustrates the enhanced curvature of the valence band in the (100) direction.

FIG. 4C shows the calculated band structure from both the gamma and Z point for both bulk silicon (continuous lines) and for the 5/1/3/1 Si/O structure of the superlattice 25' of FIG. 3 (dotted lines). Due to the symmetry of the 5/1/3/1 Si/O structure, the calculated band structures in the (100) and (010) directions are equivalent. Thus, the conductivity effective mass and mobility are expected to be isotropic in the plane parallel to the layers, i.e. perpendicular to the (001) stacking direction. Note that in the 5/1/3/1 Si/O example the conduction band minimum and the valence band maximum are both at or close to the Z point.

Although increased curvature is an indication of reduced effective mass, the appropriate comparison and discrimination may be made via the conductivity reciprocal effective mass tensor calculation. This leads Applicant to further theorize that the 5/1/3/1 superlattice 25' should be substantially direct bandgap. As will be understood by those skilled in the art, the appropriate matrix element for optical transition is another indicator of the distinction between direct and indirect bandgap behavior.

Figure 5:
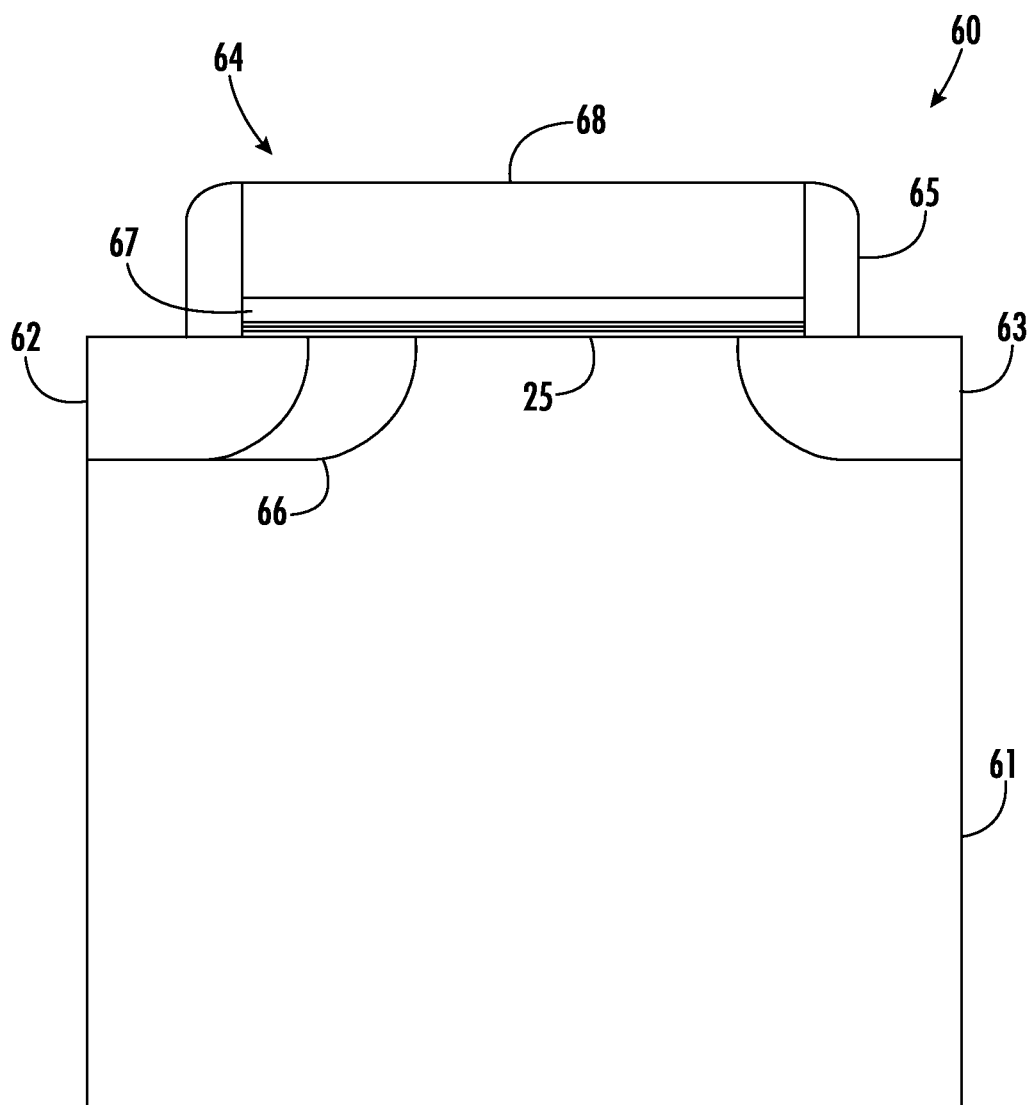
FIG. 5 is a schematic block diagram of a MOSFET including a superlattice providing an asymmetric channel in accordance with an example embodiment.
Figure 6A:
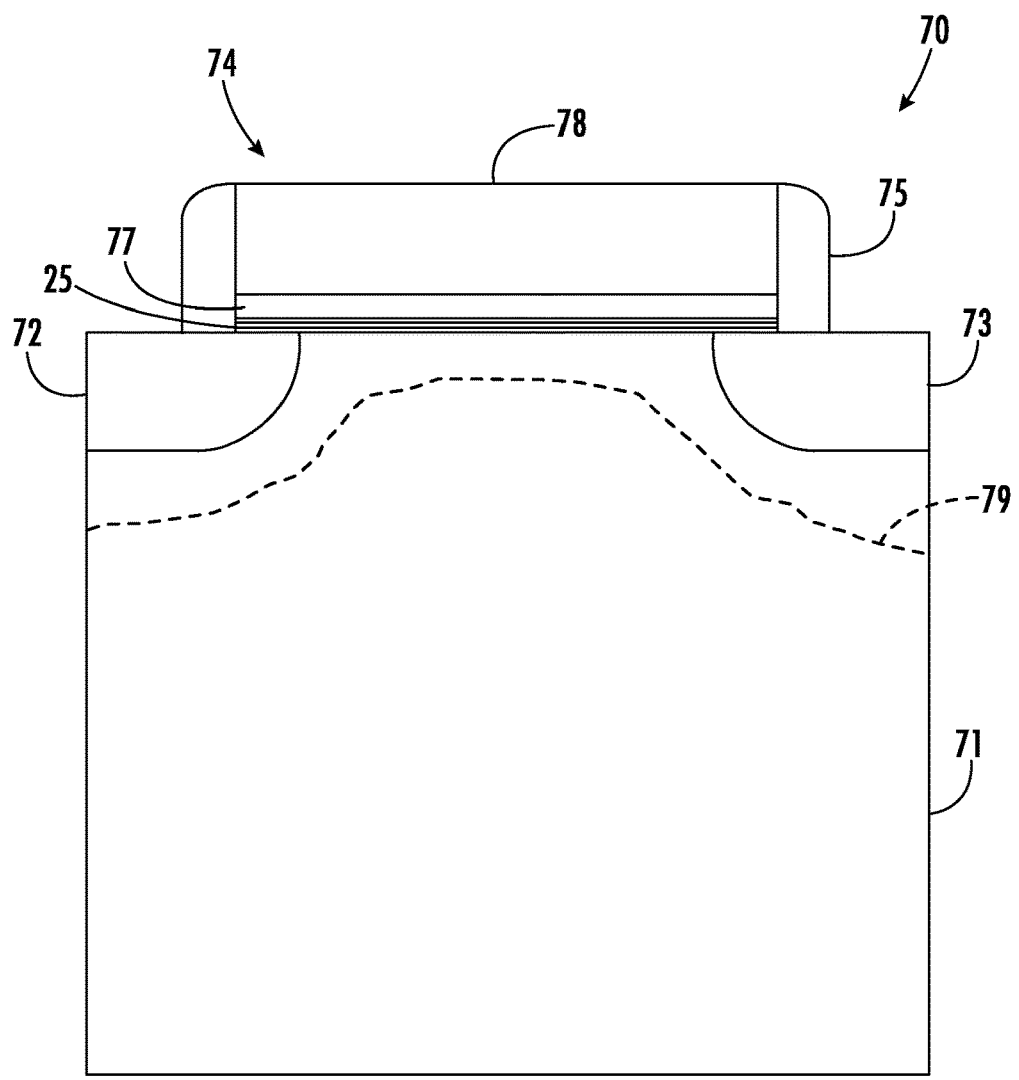
FIG. 6A is a schematic block diagram of a semiconductor device including a symmetrical, doped channel in accordance with the prior art with associated doping profile.
Figure 6B:
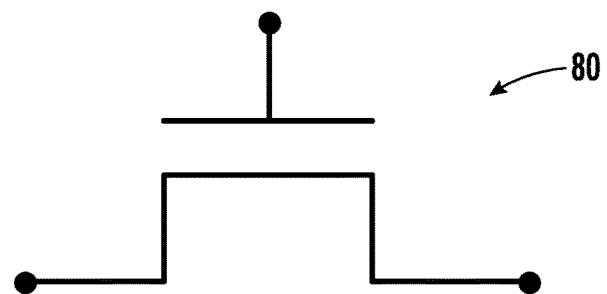
FIG. 6B is a schematic equivalent diagram of the semiconductor device of FIG. 6A.

Using the above-described superlattice structures, semiconductor devices may be fabricated in which an MST layer is positioned to carefully constrain a dopant on one end of a channel region to create an asymmetric channel device. One such example is a MOSFET 60 now described with reference to FIG. 5. The MOSFET 60 illustratively includes a substrate 61, spaced apart source and drain regions 62, 63 in the substrate defining a channel region therebetween, a superlattice 25 extending between the source and drain regions, and a gate 64 overlying the channel with sidewall spacers 65 laterally adjacent the gate. Various types of gates 64 may be used in different embodiments. In the illustrated example, the gate 64 includes a gate dielectric 67 (e.g., $SiO_2$, etc.) and a gate electrode 68 (e.g., polysilicon), although other gate structures such as a replacement metal gate may also be used. The channel may be formed or defined at least partially in the superlattice 25 in some embodiments, although it need not be in all embodiments. The superlattice 25 may also be partially or fully recessed within the substrate 21 in some embodiments, or on top of the substrate as shown in the illustrated example.

The dopant constraining ability of the superlattice 25 described above is advantageously leveraged in the present example to constrain a dopant in an extension region 66 (which may be more lightly doped than the source region 62) on the left side of the channel adjacent the source region. That is, the dopant forming the extension region 66 is implanted only on one side of the channel region, and the dopant constraining ability of the superlattice 25 advantageously prevents the dopant in this region from "smearing" or creeping across the channel toward the drain 63 during subsequent processing after the formation of the superlattice. The source region 62 and extension region 66 may conceptually be considered as one doped region (here the source region) that is larger than the opposing drain region. It should be noted that in different embodiments the channel dopant 66 may be constrained on the opposite (i.e., drain) side of the channel region as well.

Figure 7A:
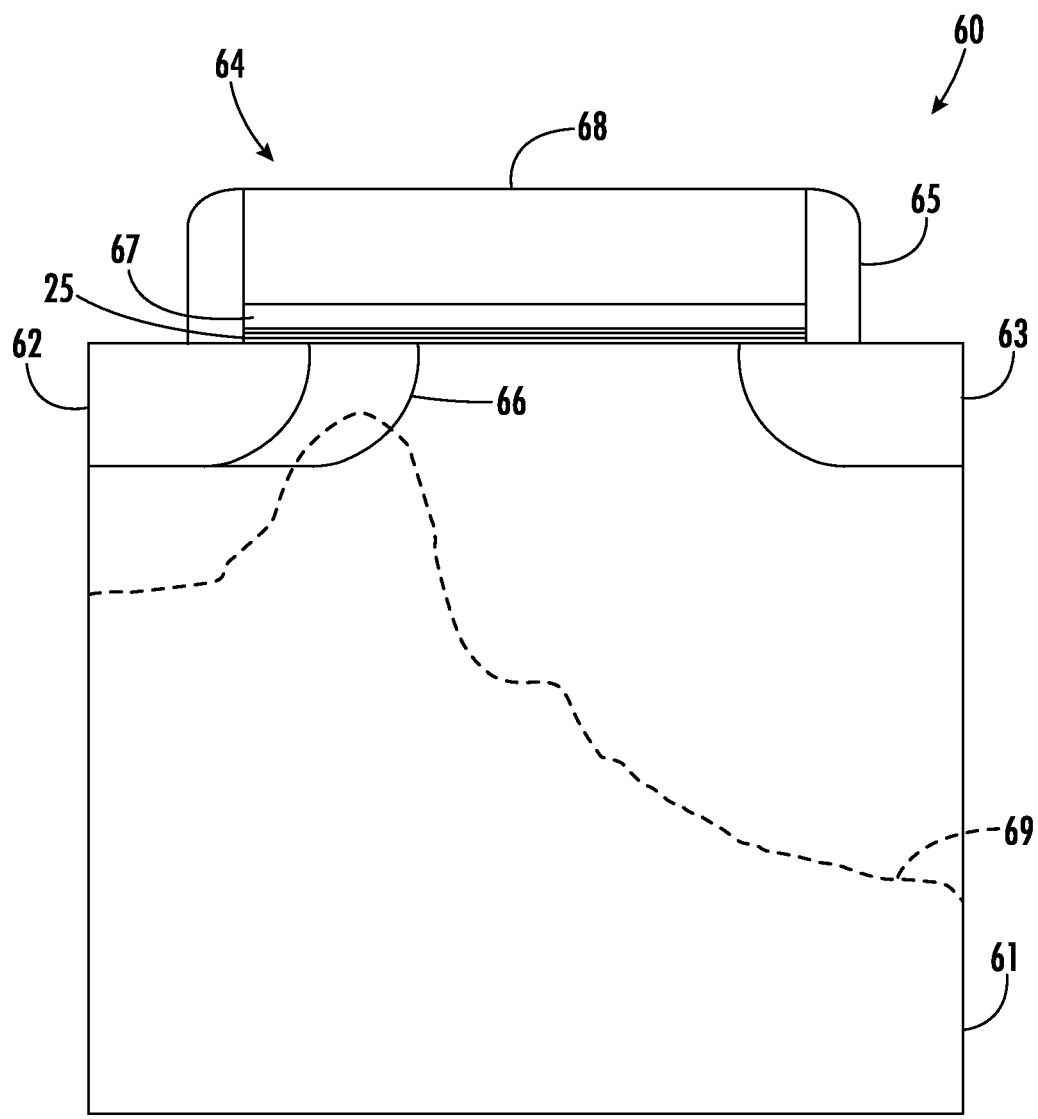
FIG. 7A is a schematic block diagram of a semiconductor device of FIG. 5 including an asymmetric, undoped channel.
Figure 7B:
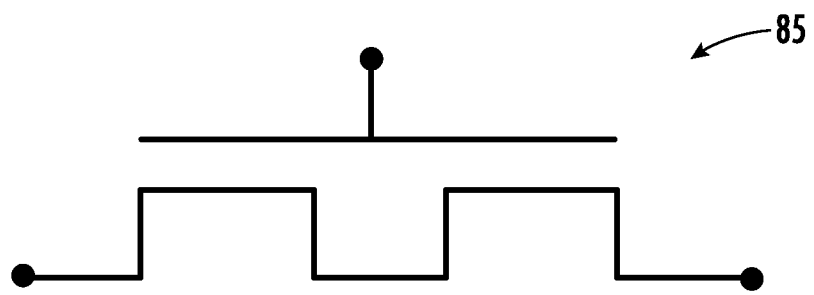
FIG. 7B is a schematic equivalent diagram of the semiconductor device of FIG. 7A.
Figure 8:
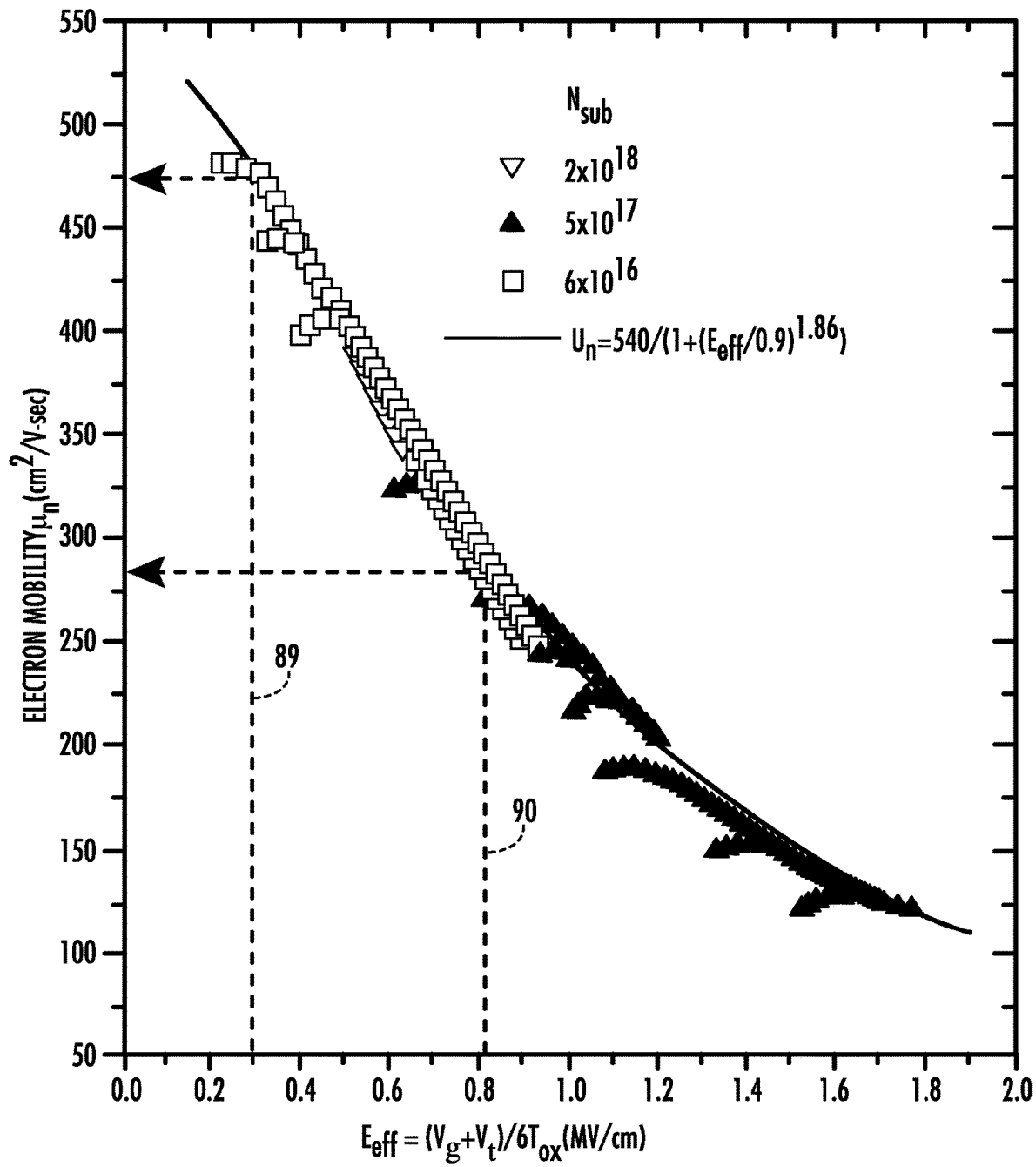
FIG. 8 is a graph of effective field vs. mobility for the semiconductor devices of FIGS. 6A and 7A.

Turning to FIGS. 6A-7B and the graph 88 of FIG. 8, a comparison between a conventional MOSFET 70 including an MST layer 25 under a gate 74 with a doped channel, vs. the MOSFET 60 with an undoped channel is now provided. The MOSFET 70 illustratively includes a substrate 71, spaced apart source and drain regions 72, 73 defining the channel region therebetween, and the superlattice 25 and gate 74 overlying the channel region. The gate illustratively includes a gate dielectric 77 and gate electrode 78. Sidewall spacers 75 are laterally adjacent the gate.

In the MOSFET 70, an acceptor dopant is present in the channel center region, as illustrated by the shape of the dopant profile 79 (the dashed line transposed on top of the MOSFET) which peaks at the center of the channel region. This configuration results in an equivalent circuit diagram of a single switch 80 providing a single threshold voltage Vt for the MOSFET 70.

By contrast, the MOSFET 60 includes acceptor dopants only in the extension region 66 near the source 62 side and not in the remainder of the channel. This results in a dopant profile 69 which peaks at the extension region and is much lower in the channel center and drain 63 regions compared to the conventional MOSFET 70. This dopant profile advantageously allows for Vt control as well as breakdown control, yet while also improving carrier mobility by eliminating the acceptor dopant in channel center region. Moreover, this advantageously helps reduce the effective field at the same Vt, may provide improved mobility (and accordingly drive current improvement), and allows for a lightly doped drain (LDD) configuration to help retain hot carrier immunity, as will be appreciated by those skilled in the art. As discussed above, the MST superlattice 25 advantageously provides accurate dopant diffusion control to allow such gate length scaling, as well as further mobility improvement. A graph 88 of effective field vs. mobility for the MOSFET 60 (plot line 89) and the MOSFET 70 (plot line 90) are shown in FIG. 8.

The equivalent circuit diagram 85 of the MOSFET 60 is shown in FIG. 7B. More particularly, the equivalent circuit is that of a first source-side switch in which the acceptor dopants define the device Vt and retain the breakdown voltage (DV), and a second switch at the channel center with a relatively low Vt without dopant, which advantageously improves drive current via the low field. More particularly, in a simulation of the MOSFET 60, an appropriate 20% Idlin and 40% Idsat short-channel improvement were projected by TOAD modeling. The increased Idlin is due to mobility improvement by reduction of effective field in the channel. Further Idsat enhancement is due to reduced body effect by low channel doping at the drain 63 side.

Experimental data for a 5V NMOS device utilizing the above-described structure shows clear Jdlin/Joff improvement over both baseline and undoped channel control devices at target 0.7 µm gate length (Lg), enabling an Lg reduction from 0.7 µm to ~0.25 µm. Moreover, the undoped NMOS channel device has 25% improvement over a 5V NMOS baseline version of the MOSFET 70, as well as lower Joff. Moreover, the undoped channel design of the MOSFET 60 also demonstrated a clear Rsp reduction (15%) at the same Vtlin over both baseline and undoped channel control devices at a target 0.7 um Lg. In addition, this device also shows >1V improved BVDSS, in addition to 15% Rsp reduction at a target Lg=0.7 µm, allowing for Lg scaling. More particularly, Imax (and BVDSS, Ioff) and Joff indicate that further Lg scaling may be achieved with the MOSFET 60 design to stay within an Imax/BVDSS specification of the baseline target MOSFET device 70. Furthermore, Rsp reduction of 15% for matched Lg 0.7 um devices may potentially be increased to 50% by Lg scaling of the MST design, while remaining within BVDSS and Imax specification of the baseline target device 70.

Figure 9:
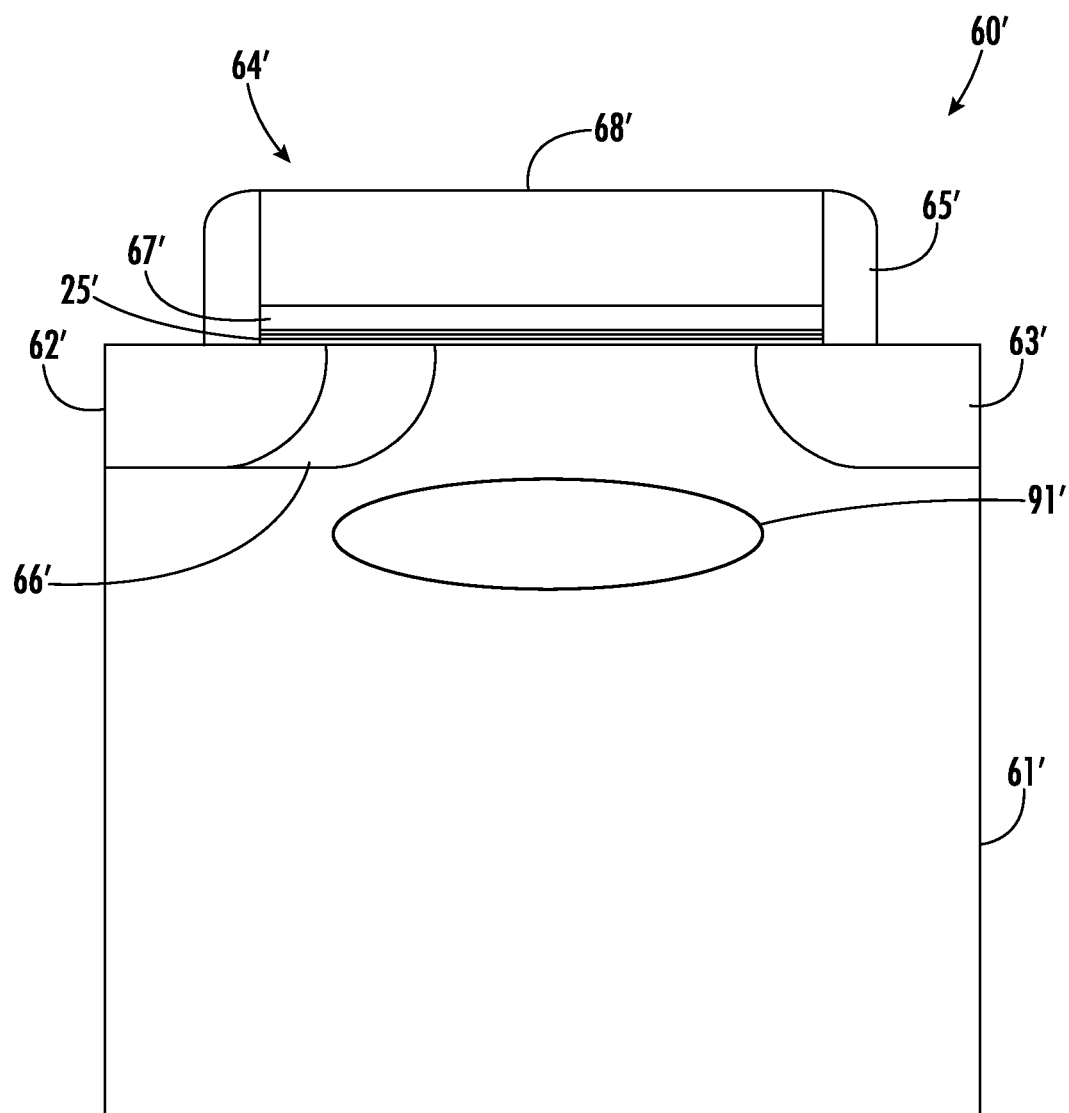
FIG. 9 is a schematic block diagram of an alternative embodiment of the semiconductor device of FIG. 5 including a punch through stop implant.

In accordance with an alternative embodiment of the MOSFET 60' shown in FIG. 9, a punch through stop (PTS) implant 91' may also be doped within the substrate 61' beneath the channel region. An example method for making the MOSFETs 60 and 60' is now described with reference to the flow diagram 100 of FIG. 10. Beginning at Block 101, the method begins with a PTS implant and rapid thermal anneal (RTA), at Block 102 (this step is for the MOSFET 60' only), followed by epitaxial growth of the MST superlattice 25, 25' (Block 103), as described above. It should be noted that adding the PTS implant 91' prior to the MST superlattice 25' growth may advantageously improve BVDSS otherwise limited by punch-through due to short-channel effect.

The gate insulator 67, 67' (e.g., $SiO_2$) may then be formed (Block 104), followed by polysilicon chemical vapor deposition (CVD) of the gate electrode 68, 68' material (Block 105) and gate patterning (Block 106). Again, it should be noted that in different embodiments, different types of gate configurations may be used (e.g., a replacement metal gate). A re-oxidation of the polysilicon gate electrode 68, 68' may be performed (Block 107) prior to implanting of the extension region 66, 66' and an optional halo implant opposite the extension region (which will be discussed further below), at Block 108, followed by another RTA step (Block 109). In this example, the LDD and halo implants are advantageously performed using the same mask. The method further illustratively includes sidewall spacer 65, 65' formation, at Block 110, implantation of the source and drain regions 62, 62' and 63, 63' and RTA (Blocks 111-112), followed by source/drain/gate silicide and contact formation and metallization (Blocks 113-114) to complete the devices 60, 60' (Block 115).

Figure 10:
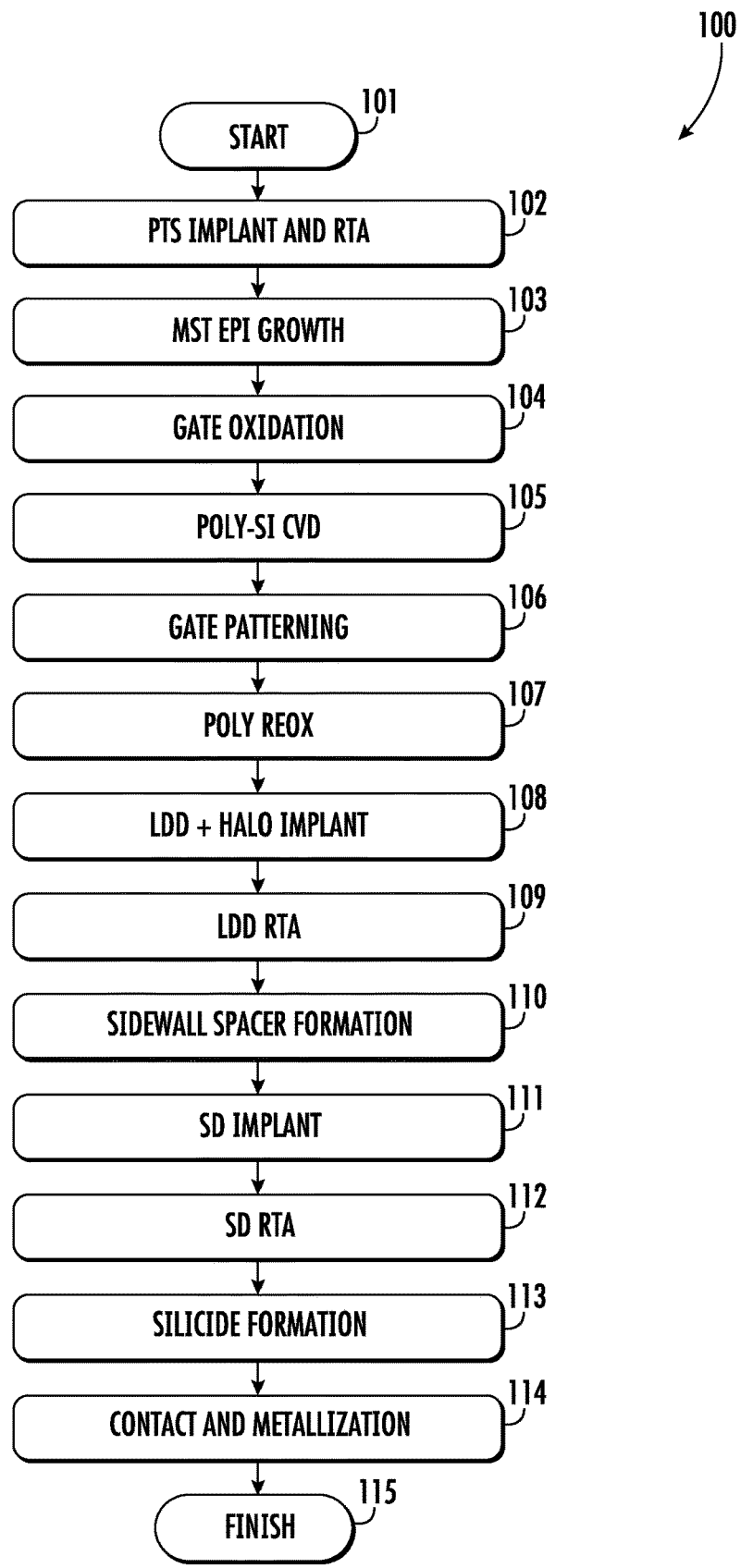
FIGS. 10 and 11 are flow diagram illustrating methods for making semiconductor devices including asymmetric channels in accordance with example embodiments.
Figure 11:
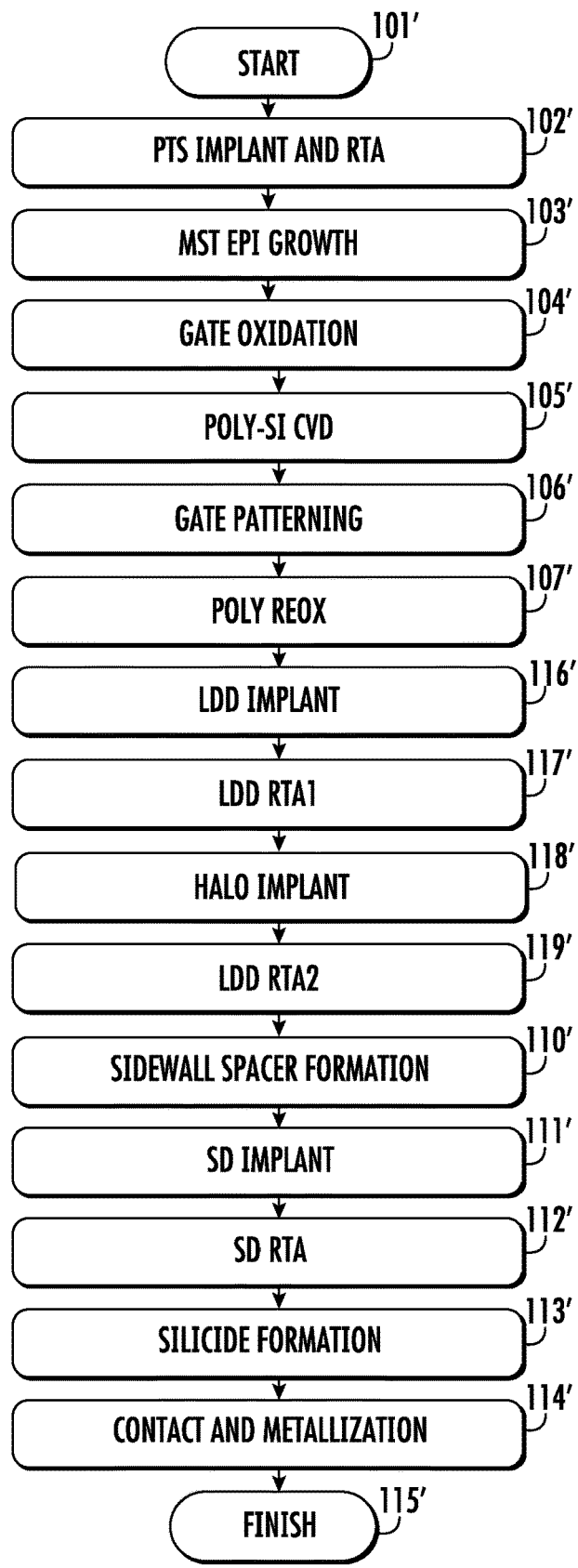

Referring additionally to the flow diagram 100' of FIG. 11, in an alternative embodiment the steps 108-109 shown in FIG. 10 may be altered to first perform the extension region 66, 66' (Block 116'), followed by an RTA (Block 117'), then the halo implant 91' (Block 118') and another RTA (Block 119'). This may advantageously provide further performance improvement/device scaling by inserting the RTA step (Block 117') between the extension implant (Block 116') and halo implant (Block 118'), by minimizing undesirable TED (transient-enhanced diffusion) of halo dopants induced by point defects introduced by implant damages. That is, this RTA advantageously helps eliminate point defects introduced by the implant to suppress undesirable TED of halo dopants.

The devices 60, 60' may be used in a variety of applications, including power switches, radio frequency (RF) switches, CMOS images sensors, low noise devices, etc. More particularly, the above-described device configurations are effective in reducing 1/f noise because they help eliminate dopants from the channel center, and thus Coulomb scattering. Moreover, as noted above, TED suppression resulting from the insertion of the RTA between extension and halo implants may also advantageously be effective for noise reduction as well. Furthermore, introduction of the PTS implant 91' may advantageously help improve short-channel control.

The MST superlattice 25, 25' advantageously provides for dopant peak anchoring and SSR channel formation through interstitial trapping. More particularly, in a conventional silicon substrate, the implant-defined dopant peak smears out due to OED (oxidation-enhanced diffusion). Moreover, gate oxidation injects Si interstitials, while boron and phosphorus diffusion is mediated by silicon interstitials. The MST superlattice 25, 25' oxygen monolayers advantageously block interstitial diffusion, and advantageously allow for the retention of a surface undoped channel through the fabrication process.

In particular, the impact of OED was simulated in a 180 nm process flow. In this simulation, the gate oxidation thermal budget was turned on and off to see the OED effect. The MST epitaxial film was deposited after the PTS implant and well RTA. The simulation revealed that OED eliminates surface undoped channel layer and degrades short-channel control. In this simulation, the PTS implant 91' was introduced ~0.15 um from the substrate 61' surface in the 180 nm node. To prevent punch-through between deep source/drain regions (Xj~0.2 um), Xj is scaled in 55 nm node.

In another example embodiment, hot carrier reliability for short channel devices may be improved by including an extension implant only on the drain side of the device and not the source side. That is, skipping the source-side extension implant may advantageously increase Leff (effective gate length). Further, increased Leff increases Vdsat to reduce impact ionization rate and thus to improve hot carrier reliability. Hot carrier degradation is driven by Vd-Vdsat, which increases for shorter gate length. A lower dose of source-side LDD increases Leff and thus improves hot carrier injection.

In some embodiments, a P-body layer may be incorporated in the MOSFETs 60, 60' (e.g., for power switch device configurations) to avoid hot carrier immunity. That is, the P-body layer reduces body resistance to avoid build-up of holes generated by impact ionization via a lower IR drop. However, when the P-body layer is too shallow, it can degrade BVDSS. From experimental data, it was concluded that a P-body layer depth that may be used to maintain desired BVDSS was >0.6 μm for a 180 nm process, although different dimensions may be possible in different configurations.

Figure 12:
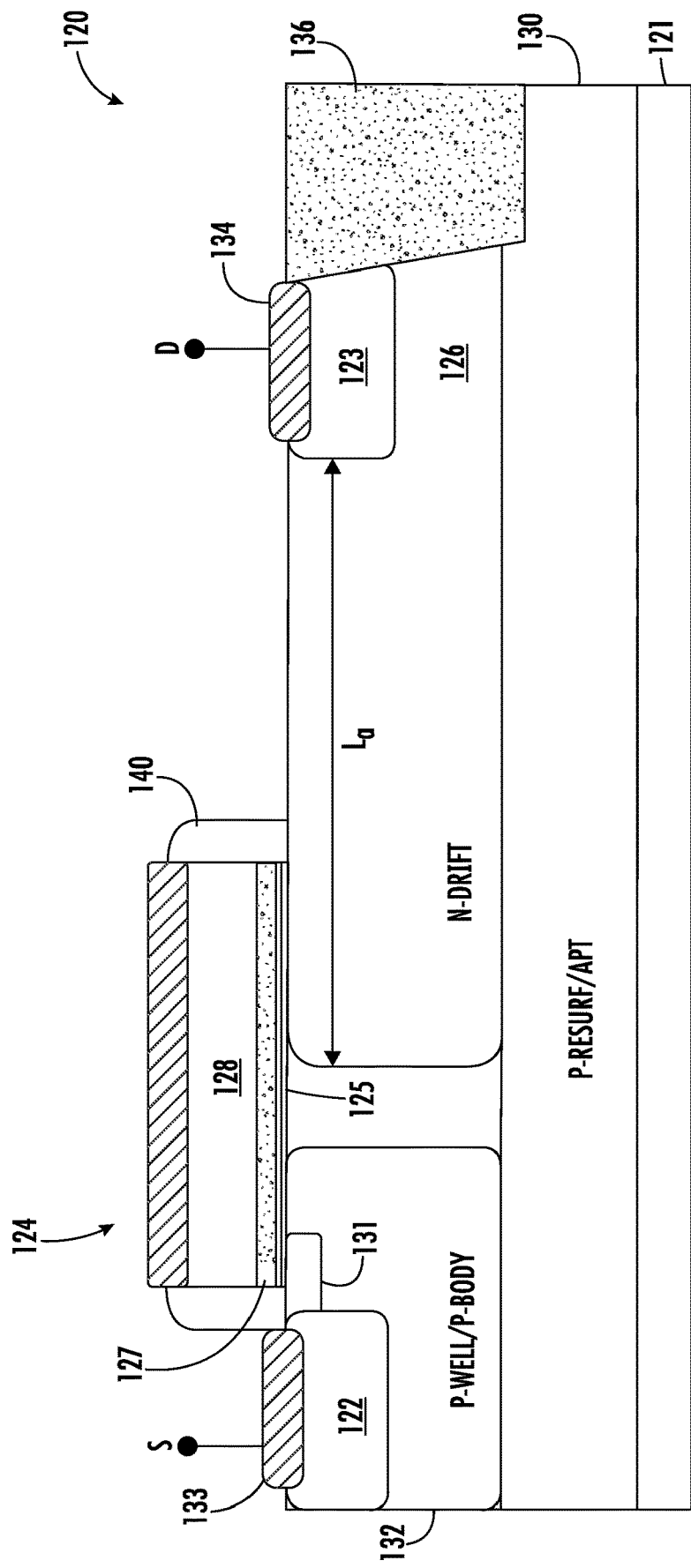
FIG. 12 is a schematic block diagram of an LV-DEMOS device including an asymmetric channel in accordance with an example embodiment.

Examples of devices including P-well/P-body regions will now be described with reference to FIGS. 12-15. More particularly, the MOSFET 120 of FIG. 12 is a low-voltage drain extended metal oxide semiconductor (LV-DEMOS) device which illustratively includes a substrate 121, a PTS layer 130 (P-resurf/APT), source and drain regions 122, 123, an LDD source extension 131, a P-well/P-body implant 132 beneath/around the source and LDD source extension, and a drain extension region 126 (N-drift) beneath/around the drain. The extension region 126 extends more than halfway across the channel (as shown by the length $L_a$) to define an asymmetric channel as described above. An MST superlattice 125 overlies the channel region, and a gate 124 overlies the MST superlattice and illustratively includes a gate dielectric 127 and a gate electrode 128. Furthermore, sidewall spacers 140 are laterally adjacent the gate 124, and respective source, drain, and gate contacts 133, 135, 135 are also provided, along with shallow trench isolation (STI) regions 136 which may be used to isolate one MOSFET 120 from the next on a wafer.

Figure 13:
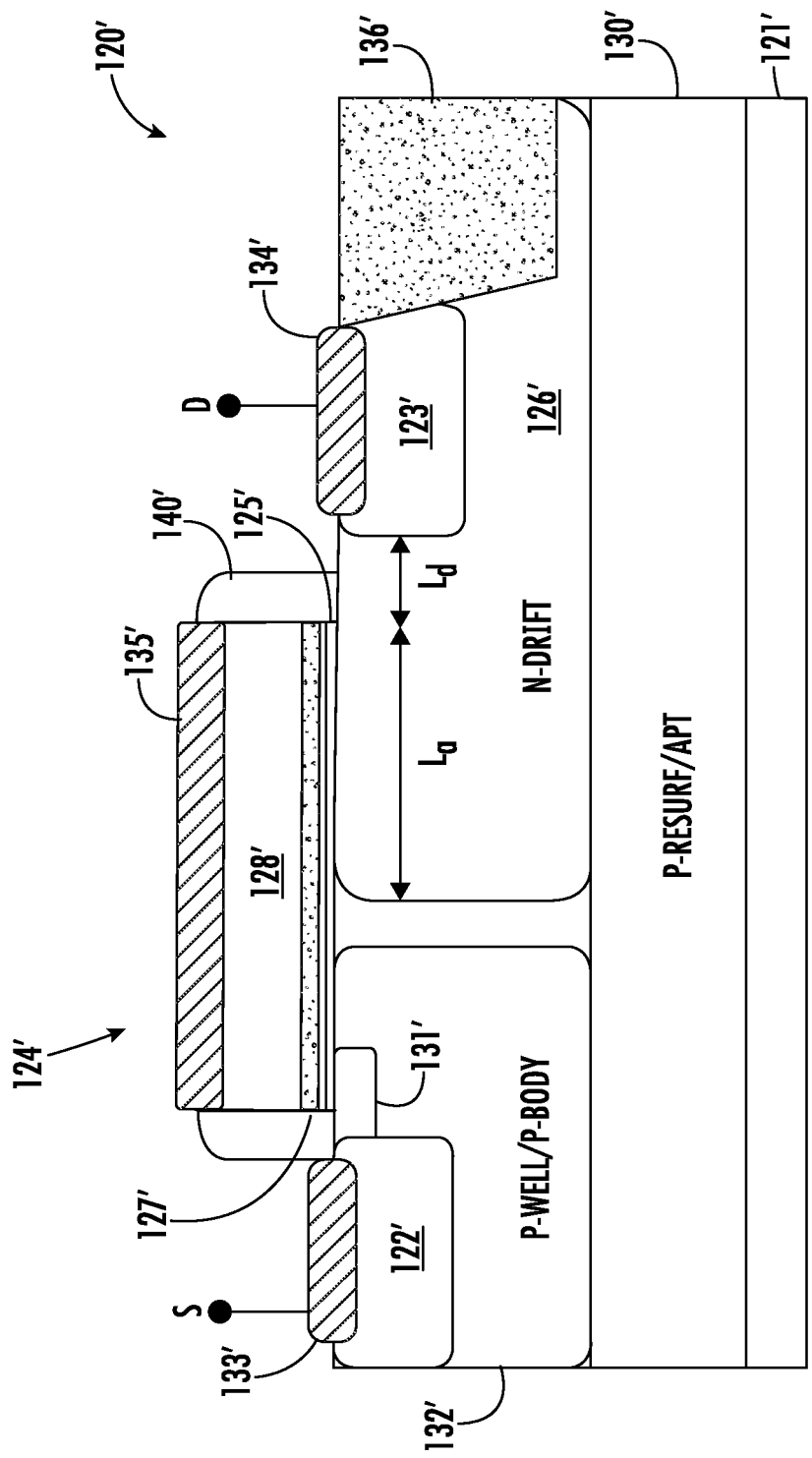
FIG. 13 is a schematic block diagram of a DEMOS device including an asymmetric channel in accordance with an example embodiment.
Figure 14:
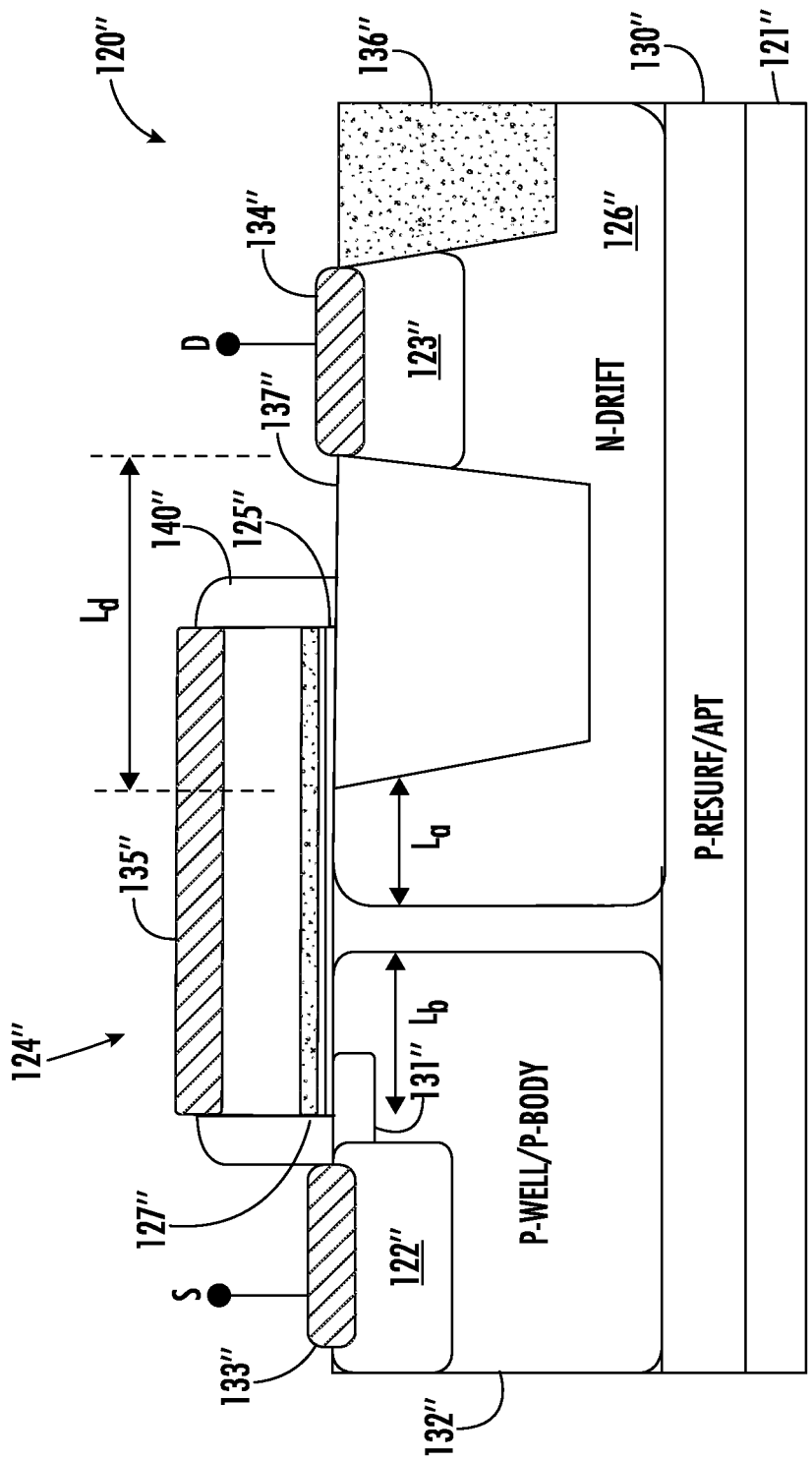
FIG. 14 is a schematic block diagram of an LDMOS device including an asymmetric channel in accordance with an example embodiment.

Another similar DEMOS device 120' is shown in FIG. 13. The device 120' is similar to the LV-DEMOS device 120 described above, but it includes an increased length ($L_d$) between the channel and the drain 123'. Still another example LDMOS 120" is shown in FIG. 14. The LDMOS 120" is similar to the DEMOS 120', but further includes an STI/LOCOS region 137' positioned in the substrate 121" between the drain 123" and the channel region, with the N-drift region 126" around the STI/LOCOS region as shown.

With the above-described configurations, the use of an angled LDD implant advantageously enables engineering for increased ruggedness due to lower parasitic base resistance. Furthermore, the use of the halo/P-well implant advantageously enables engineering for lower Ron since spacing to the P-body can be independently controlled by varying the spacing $L_a$. The P-resurf layer 130 enables engineering for optimized Ron vs. breakdown voltage (BV).

The above-described devices 120-120" advantageously provide low Ron in a high ruggedness configuration with relatively low body resistance. During manufacturing, two masks may be used for the source and drain implants. The Pwell/N-drift regions 132, 126 enable the reuse of existing implants in the flow and optimization of lateral dimensions for Ron and HCI.

Generally speaking, a shorter drawn channel or gate length (Lg) may be achieved by two approaches. The first is a zero degree source side LDD implant, resulting in less lateral encroachment. Another approach involves the use of a double sidewall spacer. More particularly, the first spacer spaces the LDD off from the gate edge (i.e., the source LDD implant is performed after the first spacer formation), but lateral straggle results in sufficient doping to be near the gate to help assure consistent and controllable Vt of the device. The second spacer spaces the source implant away from gate edge (i.e., the source/drain implants are performed after the second gate sidewall spacer is formed).

It should be noted that while the above-described techniques have been described in the context of planar MOSFET devices, they may also be used in conjunction with other device configurations, such as vertical (e.g., FINFET) devices in different embodiments, as will be appreciated by those skilled in the art. Further details on the dopant constraining ability of MST films are set forth in U.S. Pat. No.

9,941,359 to Mears et al., which is assigned to the present applicant and hereby incorporated herein in its entirety by reference. Moreover, additional features may also be found in co-pending application U.S. Pat. No. 11,094,818, issued Aug. 17, 2021, which is hereby incorporated herein in its entirety by reference.

Many modifications and other embodiments of the invention will come to the mind of one skilled in the art having the benefit of the teachings presented in the foregoing descriptions and the associated drawings. Therefore, it is understood that the invention is not to be limited to the specific embodiments disclosed, and that modifications and embodiments are intended to be included within the scope of the appended claims.

That which is claimed is:

1. A drain extended metal oxide semiconductor device (DEMOS) comprising:
 a substrate;
 spaced apart source and drain regions in the substrate;
 a well region in the substrate beneath the source;
 a drift region in the substrate beneath the drain;
 a gate overlying portions of the well region and drift region; and
 a superlattice underlying the gate and comprising a plurality of stacked groups of layers, each group of layers comprising a plurality of stacked base semiconductor monolayers defining a base semiconductor portion, and at least one non-semiconductor monolayer constrained within a crystal lattice of adjacent base semiconductor portions.

2. The semiconductor device of claim 1, comprising source and drain contacts coupled to respective ones of the source and drain regions; and wherein the drain contact is spaced further from the gate than the source contact.

3. The semiconductor device of claim 1, wherein the drift region extends further under the gate than the well region.

4. The semiconductor device of claim 1, wherein the drift region extends more than halfway under the gate.

5. The semiconductor device of claim 1, comprising a source extension region coupled to the source region.

6. The semiconductor device of claim 1, comprising a punch through stop layer beneath the well region and drift region.

7. The semiconductor device of claim 1, wherein the gate comprises a gate dielectric overlying the superlattice, and a gate electrode overlying the gate dielectric layer.

8. The semiconductor device of claim 7, comprising sidewall spacers on the substrate laterally adjacent the gate.

9. The semiconductor device of claim 1, wherein the base semiconductor monolayers comprise silicon monolayers.

10. The semiconductor device of claim 1, wherein the at least one non-semiconductor monolayer comprises oxygen.

11. A drain extended metal oxide semiconductor device (DEMOS) comprising:
 a substrate;
 spaced apart source and drain regions in the substrate;
 a well region in the substrate beneath the source;
 a drift region in the substrate beneath the drain;
 a gate overlying portions of the well region and drift region so that the drift region extends further under the gate than the well region;
 source and drain contacts coupled to respective ones of the source and drain regions, with the drain contact being spaced further from the gate than the source contact; and
 a superlattice underlying the gate and comprising a plurality of stacked groups of silicon layers, each group of silicon layers comprising a plurality of stacked base silicon monolayers defining a base silicon portion, and at least one non-semiconductor monolayer constrained within a crystal lattice of adjacent base silicon portions.

12. The semiconductor device of claim 11, wherein the drift region extends more than halfway under the gate.

13. The semiconductor device of claim 11, comprising a source extension region coupled to the source region.

14. The semiconductor device of claim 11, comprising a punch through stop layer beneath the well region and drift region.

15. The semiconductor device of claim 11, wherein the gate comprises a gate dielectric overlying the superlattice, and a gate electrode overlying the gate dielectric layer.

16. The semiconductor device of claim 15, further comprising sidewall spacers on the substrate laterally adjacent the gate.

17. The semiconductor device of claim 11, wherein the at least one non-semiconductor monolayer comprises oxygen.

* * * * *